United States Patent
Mitsuda et al.

[19]

[11] Patent Number: 5,978,535
[45] Date of Patent: Nov. 2, 1999

[54] SEMICONDUCTOR LASER MODULE, OPTICAL FIBER AMPLIFIER AND OPTICAL TRANSFER SYSTEM

[75] Inventors: Masahiro Mitsuda, Kyoto; Souichi Kimura, Osaka; Tomoaki Uno, Hyogo, all of Japan

[73] Assignee: Matsushita Electric Industrial Co., Ltd., Osaka, Japan

[21] Appl. No.: 09/039,379

[22] Filed: Mar. 16, 1998

[30] Foreign Application Priority Data

Mar. 17, 1997 [JP] Japan .................................. 9-062784

[51] Int. Cl.⁶ .............................. G02B 6/36; H01S 3/091; H01S 3/00
[52] U.S. Cl. .............................. 385/88; 385/92; 385/93; 385/11; 385/33; 372/75; 372/703; 359/341
[58] Field of Search .................................. 385/88, 89, 90, 385/91, 92, 93, 94, 11, 33, 49; 372/703, 6, 75; 359/341

[56] References Cited

U.S. PATENT DOCUMENTS

| | | | |
|---|---|---|---|
| 5,416,869 | 5/1995 | Yoshino | 385/88 |
| 5,566,264 | 10/1996 | Kuke et al. | 385/49 |
| 5,712,940 | 1/1998 | Van Roemburg et al. | 385/93 |
| 5,841,922 | 11/1998 | Iwatsuka et al. | 385/76 |

FOREIGN PATENT DOCUMENTS

| | | |
|---|---|---|
| 56-49517 | 9/1954 | Japan . |
| 1-81927 | 3/1989 | Japan . |
| 1-99018 | 4/1989 | Japan . |

*Primary Examiner*—Hemang Sanghavi
*Attorney, Agent, or Firm*—McDermott, Will & Emery

[57] ABSTRACT

An active layer of a semiconductor laser element held by a laser mount is formed to be closer to the bottom than to the center of the height of the semiconductor laser element. A laser beam emitted from the active layer passes through a collective lens and an optical isolator and enters an incidence portion of an optical fiber. Returning light reflected by the incidence portion of the optical fiber passes through the optical isolator and the collective lens and is collected onto an end face of the laser mount. The optical isolator includes first and second rutiles which transmit normal light with refraction and abnormal light without refraction, a Faraday element which rotates a polarization plane of transmitted light in the clockwise direction by 45 degrees, and a permanent magnet for applying a magnetic field to the Faraday element.

8 Claims, 23 Drawing Sheets

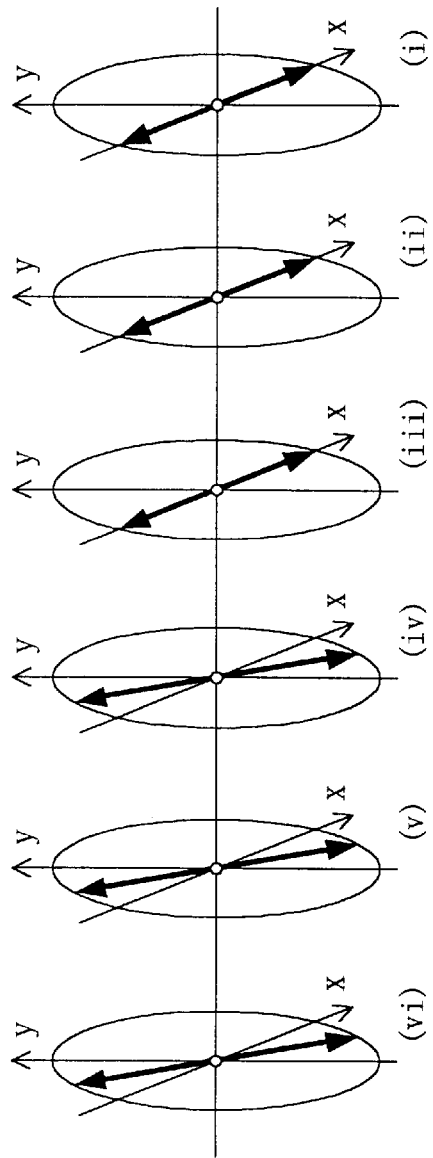
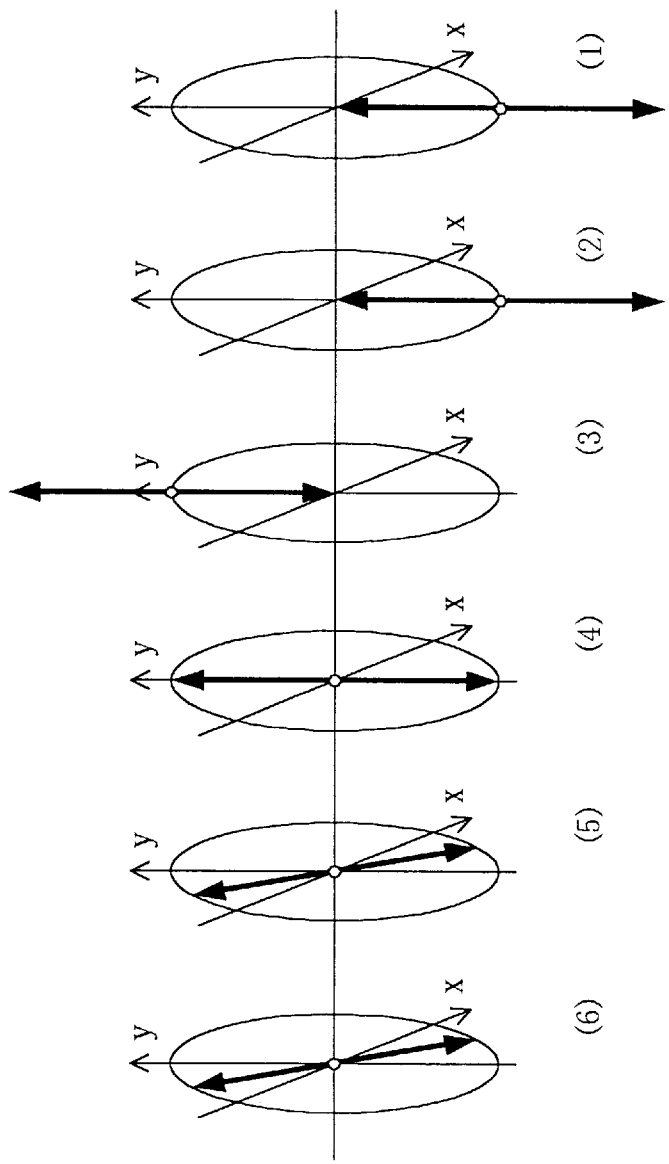
Fig. 3(a)
Fig. 3(b)

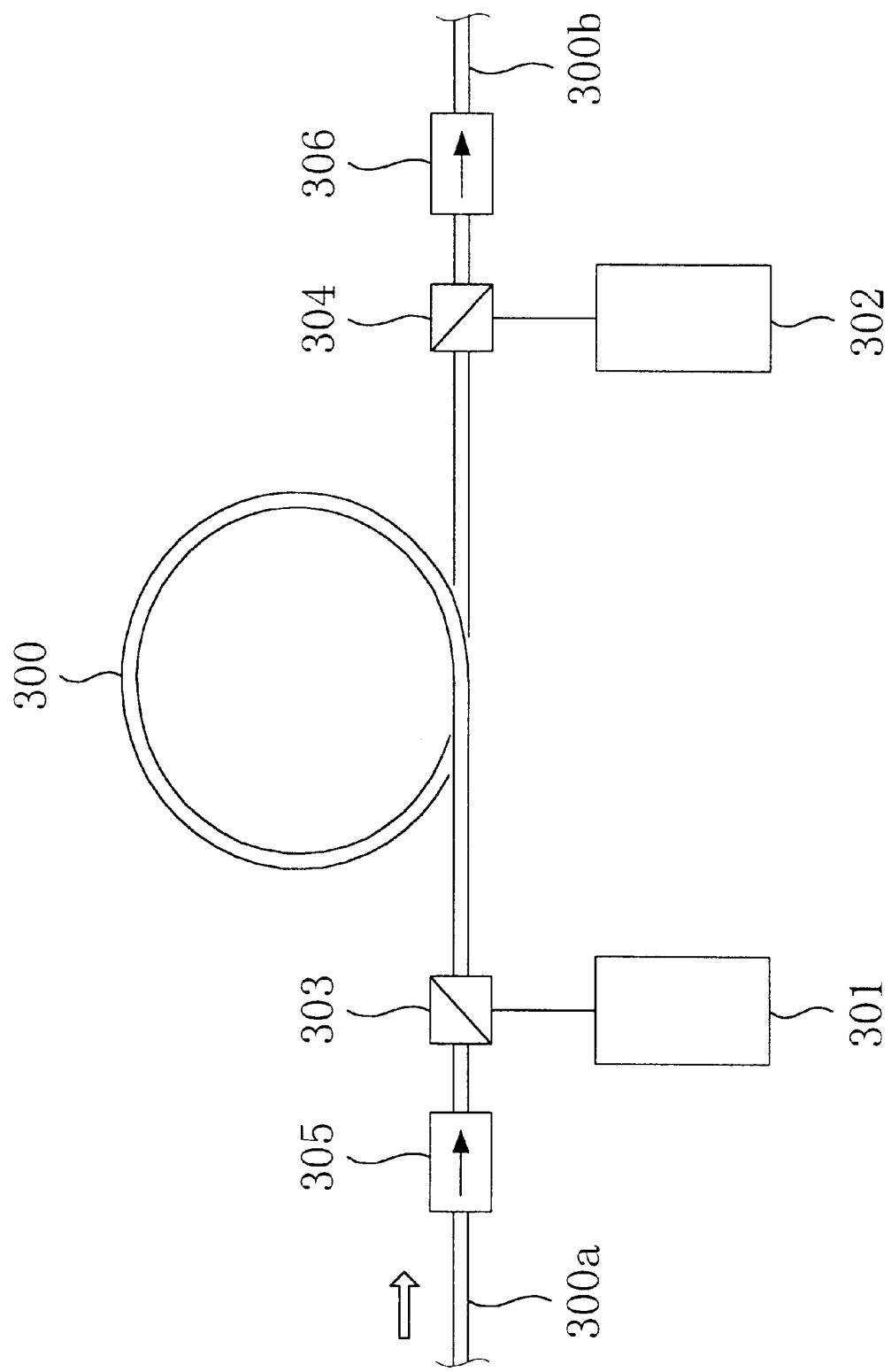

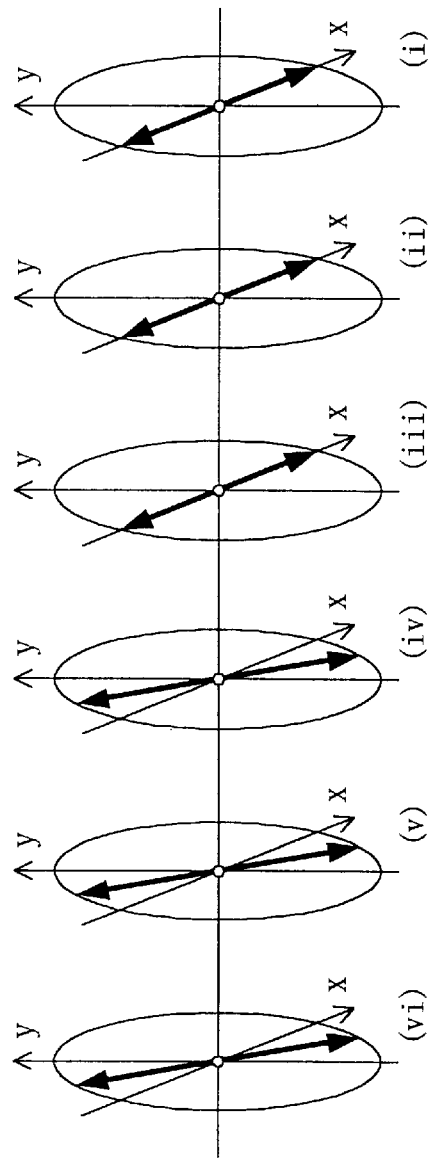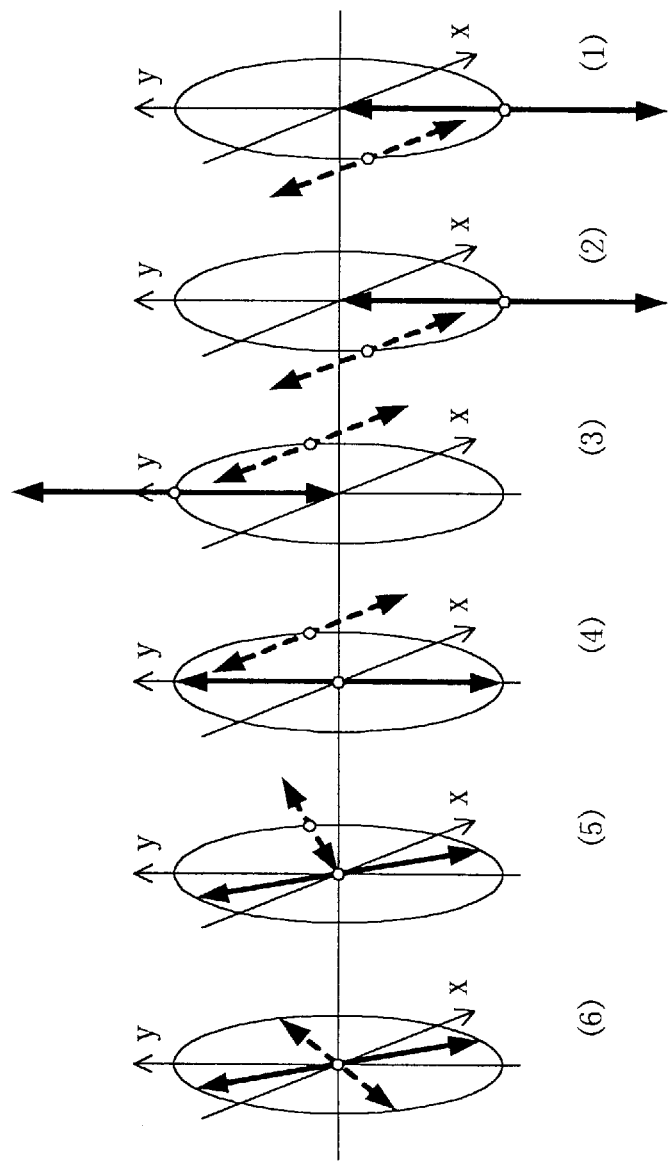
Fig. 22(a) Prior Art
Fig. 22(b) Prior Art

SEMICONDUCTOR LASER MODULE, OPTICAL FIBER AMPLIFIER AND OPTICAL TRANSFER SYSTEM

BACKGROUND OF THE INVENTION

The present invention relates to a technique, for use in a semiconductor laser module provided with an optical isolator including a doubly refracting crystal plate and a Faraday element, and an optical fiber amplifier and an optical transfer system using the semiconductor laser module, to stabilize output power by suppressing an influence of returning light emitted by a semiconductor laser element and reflected by an optical fiber.

An optical transfer system utilizes a large number of semiconductor laser elements such as a semiconductor laser element working as a light source of signal light and a semiconductor laser element working as a pump light source in an optical fiber amplifier. Such a semiconductor laser element is built in a semiconductor laser module connected with a transfer optical fiber and an amplification optical fiber. In this case, a laser beam emitted by the semiconductor laser element built in the semiconductor laser module can be reflected by an incidence portion of the optical fiber, resulting in entering the semiconductor laser element as returning light. As a result, an optical output power of the pump light source can be varied and the optical transfer system can be degraded in its noise characteristic.

Furthermore, when a laser beam emitted by a semiconductor laser element working as the pump light source built in the optical fiber amplifier enters another semiconductor laser element, a current output from a monitor PD (photo detector) of the latter semiconductor laser element can be increased. As a result, the output power of the semiconductor laser element cannot be constantly controlled.

As a countermeasure against these problems, an optical isolator, which prevents returning light reflected by an optical fiber and a laser beam emitted by a semiconductor laser element in a pump light source from entering a semiconductor laser element, is generally built in the semiconductor laser module.

A known optical isolator to be built in a semiconductor laser module comprises, as is described in Japanese Laid-Open Utility Model Publication No. 56-49517 and Japanese Laid-Open Patent Publication No. 1-99018, a pair of doubly refracting crystal plates, such as rutile optical crystal plates (hereinafter referred to as the rutiles), and a Faraday element. FIG. 20 shows the sectional structure of a semiconductor laser module described as a first conventional example provided with the optical isolator including the doubly refracting crystal plates and the Faraday element. As is shown in FIG. 20, a laser mount 2 is provided on a Peltier element 1 disposed in a package not shown, and a semiconductor laser element 3 is held on the laser mount 2. A laser beam (whose optical path is shown with a solid line) emitted from an active layer 4 of the semiconductor laser element 3 in one direction (in the leftward direction in FIG. 20) is collected by a collective lens 5 so as to reach an optical isolator 6, passes through the optical isolator 6 and enters an incidence portion of an optical fiber 7. Then, returning light reflected by the incidence portion of the optical fiber 7 (whose optical path is shown with a broken line) passes through the optical isolator 6 and the collective lens 5 and enters the semiconductor laser element 3. On the other hand, a laser beam emitted by the semiconductor laser element 3 in another direction (in the rightward direction in FIG. 20) is detected for its light intensity by a monitor PD 8, and the thus detected intensity is converted into a current signal to be used for controlling the output power of the semiconductor laser element 3.

The optical isolator 6 includes a first doubly refracting crystal plate 11, a second doubly refracting crystal plate 12, a Faraday element 13 disposed between the first and second doubly refracting crystal plates 11 and 12, and a permanent magnet 14 for applying a magnetic filed to the Faraday element 13. The first and second doubly refracting crystal plates 11 and 12 transmit light having a polarization plane parallel to their optical axes (that is, abnormal light) with refraction, and transmit light having a polarization plane perpendicular to their optical axes (that is, normal light) without refraction. The Faraday element 13 transmits incident light with its polarization plane always rotated by a predetermined angle, for example, by 45 degrees, in one direction. FIG. 21(a) shows the direction of the optical axis (Y-axis positive direction) of the first doubly refracting crystal plate 11, FIG. 21(b) shows the direction and the angle (herein 45 degrees in the clockwise direction) for rotating the polarization plane of incident light by the Faraday element 13, and FIG. 21(c) shows the direction of the optical axis (a direction between the Y-axis positive direction and the X-axis positive direction) of the second doubly refracting crystal plate 12. In a coordinate system used in these drawings, a direction parallel to the surface of the active layer 4 of the semiconductor laser element 3 and perpendicular to a direction of a resonator corresponds to the X-axis and a direction perpendicular to the surface of the active layer 4 corresponds to the Y-axis.

In FIG. 22(a), thick solid arrows indicate polarization directions of output light emitted by the semiconductor laser element 3 in one direction toward the optical fiber 7, and the arrow shown in (i) indicates the polarization direction immediately after it is emitted from the active layer 4 of the semiconductor laser element 3, the arrow shown in (ii) indicates the polarization direction when it passes through the collective lens 5, the arrow shown in (iii) indicates the polarization direction when it passes through the first doubly refracting crystal plate 11, the arrow shown in (iv) indicates the polarization direction when it passes through the Faraday element 13, the arrow shown in (v) indicates the polarization direction when it passes through the second doubly refracting crystal plate 12, and the arrow shown in (vi) indicates the polarization direction when it reaches the incidence portion of the optical fiber 7. In FIG. 22(b), thick solid arrows indicate polarization directions of returning light reflected by the optical fiber 7, and the arrow shown in (6) indicates the polarization direction immediately after it is reflected by the incidence portion of the optical fiber 7, the arrow shown in (5) indicates the polarization direction when it passes through the second doubly refracting crystal plate 12, the arrow shown in (4) indicates the polarization direction when it passes through the Faraday element 13, the arrow shown in (3) indicates the polarization direction when it passes through the first doubly refracting crystal plate 11, the arrow shown in (2) indicates the polarization direction when it passes through the collective lens 5, and the arrow shown in (1) indicates the polarization direction when it returns to the semiconductor laser element 3. Description of thick broken arrows in FIG, 22(b) will be given later.

In FIG. 22(a), the output light emitted by the semiconductor laser element 3 is emitted in a TE mode having merely a polarization plane component parallel to the active layer 4 as is shown in (i), and passes through the collective lens 5 with its polarization direction unchanged so as to reach the optical isolator 6 as is shown in (ii). Since the light entering the optical isolator 6 is the normal light having the polarization direction perpendicular to the optical axis of the first doubly refracting crystal plate 11, it passes through the first doubly refracting crystal plate 11 without refraction as is shown in (iii), and is rotated by the Faraday element 13 in the clockwise direction by 45 degrees as is shown in (iv). Therefore, the light is changed to the normal light having the polarization direction perpendicular to the optical axis of the second doubly refracting crystal plate 12, and hence, it passes through the second doubly refracting crystal plate 12 without refraction as is shown in (v) and enters the incidence portion of the optical fiber 7.

In FIG. 22(b), the light is changed to the returning light by being reflected by the incidence portion of the optical fiber 7 with its polarization direction unchanged as is shown in (6). Since the light is the normal light having the polarization direction perpendicular to the optical axis of the second doubly refracting crystal plate 12, it passes through the second doubly refracting crystal plate 12 without refraction as is shown in (5), and is rotated by the Faraday element 13 in the clockwise direction by 45 degrees as is shown in (4). Therefore, the light is changed to the abnormal light having the polarization direction parallel to the optical axis of the first doubly refracting crystal plate 11, and hence, is refracted by the first doubly refracting crystal plate 11 in the Y-axis positive direction as is shown in (3). Then, the resultant light passes through the collective lens 5 with being symmetrically projected in the vertical direction and the horizontal direction by the collective lens 5 as is shown in (2), and is collected onto the semiconductor laser element 3 in a position moved from the output position of the output light in the Y-axis negative direction as is shown in (1).

In this manner, in using the optical isolator built in the semiconductor laser module of the first conventional example, the light output from the active layer 4 of the semiconductor laser element 3 does not enter the active layer 4 but is collected onto the position moved from the active layer 4 in the Y-axis negative direction. Thus, the optical isolator can exhibit its function as an isolator.

Next, an optical fiber amplifier having a high output power of +24 dBm disclosed in, for example, TECHNICAL REPORT OF IEICE EDM 96-39, CPM 96-62, OPE 96-61, LQE 96-63 will be described as a second conventional example. FIG. 23 shows the structure of the optical fiber amplifier of the second conventional example, and the optical fiber amplifier includes an amplification optical fiber 20 doped with rare earth ions, such as erbium ions, and a first semiconductor laser pump light source 21 and a second semiconductor laser pump light source 22, each including the semiconductor laser module of the first conventional example. First pump light emitted by the first semiconductor laser pump light source 21 enters the amplification optical fiber 20 through a first coupler 23, and second pump light emitted by the second semiconductor laser pump light source 22 enters the amplification optical fiber 20 through a second coupler 24. Thus, the erbium ions included in the amplification optical fiber 20 are pumped. As a result, an optical signal input through an incidence portion 20a of the amplification optical fiber 20 is amplified during it passes through the amplification optical fiber 20, so as to be output from an output portion 20b of the amplification optical fiber 20.

In FIG. 23, a solid arrow shows the state of the second pump light emitted by the second semiconductor laser pump light source 22 to enter the first semiconductor laser pump light source 21, and a broken arrow shows the state of the first pump light emitted by the first semiconductor laser pump light source 21 to enter the second semiconductor laser pump light source 22.

Furthermore, in FIG. 22(b), the thick solid arrows and the thick broken arrows indicate polarization directions of light emitted by a semiconductor laser element of the first or second semiconductor laser pump light source 21 or 22 and entering another semiconductor laser element of the second or first semiconductor laser pump light source 22 or 21. The polarization directions shown with the thick solid arrows have already been described, and the polarization directions shown with the thick broken arrows will now be described. In FIG. 22(b), the light having the polarization direction as is shown in (6) is the abnormal light having the polarization direction parallel to the optical axis of the second doubly refracting crystal plate 12, and hence, it is refracted by the second doubly refracting crystal plate 12 in a direction between the X-axis positive direction and the Y-axis positive direction as is shown in (5). Then, it is rotated by the Faraday element 13 in the clockwise direction by 45 degrees as is shown in (4). As a result, the light is changed to the normal light having the polarization direction perpendicular to the optical axis of the first doubly refracting crystal plate 11, and passes through the first doubly refracting crystal plate 11 without refraction as is shown in (3). Then, the resultant light passes through the collective lens 5 with being symmetrically projected by the collective lens 5 in the vertical direction and the horizontal direction as is shown in (2), and enters the semiconductor laser element 3 in a position moved from the active layer 4 in a direction between the X-axis negative direction and the Y-axis negative direction as is shown in (1).

In a semiconductor laser element made from a GaAs material for emitting a laser beam in a region between visible light and near infrared rays, the aforementioned returning light can be absorbed in the semiconductor laser element because a loss of a semiconductor laser beam is large in an area excluding the active layer.

In a semiconductor laser element made from an InGaAsP material for emitting a laser beam in a longer wavelength band for use in optical signal transfer, however, a loss of a semiconductor laser beam is small in the area excluding the active layer. Therefore, the returning light reflected by the optical fiber and output light from a semiconductor laser element of the pump light source cannot be absorbed in the area excluding the active layer of the semiconductor laser element. Accordingly, the light intensity detected by the monitor PD is increased, and the output power of the semiconductor laser element cannot be constantly controlled.

In this manner, although the optical isolator using the doubly refracting crystal plates such as rutile crystal plates can decrease a cost, the monitored light intensity is affected by the returning light when it is built in a semiconductor laser module. This leads to a first problem that the optical output power of the semiconductor laser element cannot be constantly controlled.

Furthermore, heat generated in the active layer of the semiconductor laser element is transferred through an area between the active layer and the laser mount (namely, a lower area in FIG. 20) of the semiconductor laser element and through the laser mount to be absorbed (cooled) by the Peltier element. At this point, the laser mount has high heat conductivity but the area between the active layer and the laser mount in the semiconductor laser element has low heat conductivity. In accordance with increase of the output power of the semiconductor laser element, a larger amount of heat is generated in the active layer. Therefore, the area between the active layer and the laser mount in the semiconductor laser element is heated, and the active layer can be resultantly heated. This leads to a second problem that the output power of the semiconductor laser element cannot be increased.

Moreover, the optical fiber amplifier of the bidirectional pumping system of the second conventional example is good in the amplifying ability, but the output power of the pump light source is desired to be further increased because of demands for further improvement in the amplifying ability. Therefore, when the output level of signal light is low, pump light emitted by the semiconductor laser element of one of the pump light sources can enter the semiconductor laser element of the other pump light source. When the pump light emitted by one pump light source thus enters the semiconductor laser element of the other pump light source, the light intensity detected by the monitor PD can be increased similarly by the returning light reflected by the optical fiber described above. As a result, it becomes difficult to constantly control the output power of the semiconductor laser element.

Furthermore, when the pump light emitted by one of the pump light sources is reflected by the output face of the semiconductor laser element of the other pump light source, the reflected light is scattered in the package of the module. This also increases the light intensity detected by the monitor PD, resulting in similarly causing the problem that the output power of the semiconductor laser element cannot be constantly controlled.

SUMMARY OF THE INVENTION

The present invention was devised to totally solve the aforementioned problems. An object of the invention is avoiding a problem that output power of a semiconductor laser element cannot be constantly controlled because light intensity detected by a monitor PD is increased due to returning light reflected by an optical fiber or pump light emitted by a pump light source, and increasing the output power of the semiconductor laser element by rapidly radiating heat generated in an active layer of the semiconductor laser element.

The semiconductor laser module of this invention comprises a semiconductor laser element for emitting a laser beam from an active layer of the semiconductor laser element; a laser holder for holding the semiconductor laser element at a bottom of the semiconductor laser element; an optical isolator including a doubly refracting crystal plate, which transmits light having a polarization direction parallel to an optical axis thereof with refraction and transmits light having a polarization direction perpendicular to the optical axis thereof without refraction, and a Faraday element which rotates transmitted light in one direction by a predetermined angle; a collective lens for collecting a laser beam emitted from a first output face of the active layer of the semiconductor laser element onto the optical isolator; and a photo detector for detecting light intensity of a laser beam emitted from a second output face of the active layer of the semiconductor laser element, wherein the active layer is formed in a position away from a center of a height of the semiconductor laser element to be closer to the bottom of the semiconductor laser element, and the optical isolator and the collective lens not only collect the laser beam emitted from the first output face of the active layer of the semiconductor laser element onto an incidence portion of an optical fiber but also collect returning light reflected by the incidence portion of the optical fiber onto a portion away from the bottom of the semiconductor laser element and closer to the laser holder.

In the semiconductor laser module of the invention, since the optical isolator and the collective lens are disposed so as to collect the returning light reflected by the incidence portion of the optical fiber onto the portion away from the bottom of the semiconductor laser element and closer to the laser holder, the returning light can be prevented from entering the output face of the semiconductor laser element. In this case, since the active layer is formed in the position away from the center of the height of the semiconductor laser element to be closer to its bottom, the returning light reflected by the incidence portion of the optical fiber can be easily collected by the optical isolator and the collective lens onto the portion away from the bottom of the semiconductor laser element and closer to the laser holder. Thus, the returning light can be definitely prevented from entering the output face of the semiconductor laser element. As a result, the problem that the light intensity detected by the photo detector is increased due to the returning light can be avoided, and the output power of the semiconductor laser element can be constantly controlled.

Furthermore, since the active layer is formed in the position away from the center of the height of the semiconductor laser element to be closer to the bottom thereof, the amount of heat generated in the active layer and accumulated in the area between the active layer and the bottom of the semiconductor laser element can be decreased. Accordingly, even when a large amount of heat is generated in the active layer as a result of increase of the output power of the semiconductor laser element, the amount of heat accumulated in the area between the active layer and the bottom of the semiconductor laser element cannot be increased, and the semiconductor laser element can be prevented from being heated. Thus, the output power of the semiconductor laser element can be increased.

In the semiconductor laser module, the doubly refracting crystal plate is preferably a rutile optical crystal plate.

Thus, the problem that the light intensity of the laser beam detected by the photo detector is increased due to the returning light can be definitely avoided by using an optical isolator less expensive than a polar core type optical isolator.

In the semiconductor laser module, the optical isolator and the incidence portion of the optical fiber are preferably integrated with each other.

Thus, the polarization direction of the optical isolator can be easily adjusted with the polarization plane of the laser beam emitted by the semiconductor laser element. Also, since a distance between the incidence face of the optical fiber and the optical isolator can thus be constant, the beam diameter of the laser beam can be constant within the optical isolator, and the laser beam can be allowed to pass the center of the optical isolator. As a result, the outer dimension of the optical isolator can be minimized.

In the semiconductor laser module, the optical isolator and the collective lens preferably collect the returning light onto an end face of the laser holder, and a collected portion on the end face of the laser holder where the returning light is collected is preferably provided with an antireflection coating.

Thus, light reflected by the end face of the laser holder can be prevented from becoming stray light in a package, thereby avoiding the problem of the increase of the light intensity detected by the photo detector.

In the semiconductor laser module, the photo detector is preferably disposed with a light receiving face thereof facing away from a plane perpendicular to a plane where the active layer is formed toward the laser holder.

Thus, even when the returning light or pump light from a pump light source becomes stray light in the package, the problem of the increase of the light intensity detected by the photo detector can be avoided.

The semiconductor laser module preferably further comprises an output stabilizing device for constantly controlling an output power of the laser beam emitted from the active layer of the semiconductor laser element on the basis of an output current output by the photo detector.

Thus, the output power of the laser beam emitted from the active layer of the semiconductor laser element can be constantly controlled on the basis of the output current output by the photo detector. In this case, since the problem of the increase of the light intensity detected by the photo detector due to the returning light can be avoided in the present semiconductor laser module, the output power of the semiconductor laser element can be definitely constantly controlled.

The optical fiber amplifier of this invention comprises an amplification optical fiber doped with rare earth ions; and a pump light source for allowing pump light for pumping the rare earth ions doped in the amplification optical fiber to enter the amplification optical fiber, wherein the pump light source includes a semiconductor laser element for emitting a laser beam from an active layer of the semiconductor laser element; a laser holder for holding the semiconductor laser element at a bottom of the semiconductor laser element; an optical isolator including a doubly refracting crystal plate which transmits light having a polarization direction parallel to an optical axis thereof with refraction and transmits light having a polarization direction perpendicular to the optical axis thereof without refraction and a Faraday element which rotates transmitted light in one direction by a predetermined angle; a collective lens for collecting a laser beam emitted from a first output face of the active layer of the semiconductor laser element onto the optical isolator; a pumping optical fiber for supplying the laser beam emitted from the first output face of the active layer of the semiconductor laser element and passing through the collective lens and the optical isolator to the amplification optical fiber; and a photo detector for detecting light intensity of a laser beam emitted from a second output face of the active layer of the semiconductor laser element, the active layer is formed in a position away from a center of a height of the semiconductor laser element to be closer to the bottom thereof, and the optical isolator and the collective lens collect not only the laser beam emitted from the first output face of the active layer of the semiconductor laser element onto an incidence portion of the pumping optical fiber but also collect returning light reflected by the incidence portion of the pumping optical fiber onto a portion away from the bottom of the semiconductor laser element and closer to the laser holder.

In the optical fiber amplifier of the invention, the active layer of the semiconductor laser element of the pump light source is formed in the position away from the center of the height of the semiconductor laser element to be closer to the bottom thereof, and the optical isolator and the collective lens of the pump light source are disposed so as to collect the returning light reflected by the incidence portion of the optical fiber onto the portion away from the bottom of the semiconductor laser element and closer to the laser holder. Therefore, the returning light reflected by the pumping optical fiber and pump light from a semiconductor laser element of another pump light source can be prevented from entering the output face of the semiconductor laser element. As a result, the problem that the light intensity detected by the photo detector of the pump light source is increased due to the returning light from the pumping optical fiber and the pump light from another semiconductor laser element can be avoided. Thus, the output power of the semiconductor laser element of the pump light source can be constantly controlled with ease. Also, since the semiconductor laser element of the pump light source can be prevented from being heated, the output power of the semiconductor laser element can be increased, resulting in improving the amplifying ability of the optical fiber amplifier.

The optical transfer system of this invention comprises a signal light source for outputting signal light; a receiver for receiving the signal light; a transfer optical fiber for transferring the signal light output by the signal light source to the receiver; and an optical fiber amplifier, including an amplification optical fiber doped with rare earth ions and a pump light source for outputting pump light for pumping the rare earth ions doped in the amplification optical fiber to the amplification optical fiber, for amplifying the signal light transferred through the transfer optical fiber, wherein the pump light source of the optical fiber amplifier includes: a semiconductor laser element for emitting a laser beam from an active layer of the semiconductor laser element; a laser holder for holding the semiconductor laser element at a bottom of the semiconductor laser element; an optical isolator including a doubly refracting crystal plate which transmits light having a polarization direction parallel to an optical axis thereof with refraction and transmits light having a polarization direction perpendicular to the optical axis thereof without refraction and a Faraday element which rotates transmitted light in one direction by a predetermined angle; a collective lens for collecting a laser beam emitted from a first output face of the active layer of the semiconductor laser element onto the optical isolator; a pumping optical fiber for supplying the laser beam emitted from the first output face of the active layer of the semiconductor laser element and passing through the collective lens and the optical isolator to the amplification optical fiber; and a photo detector for detecting light intensity of a laser beam emitted from a second output face of the active layer of the semiconductor laser element, the active layer is formed in a position away from a center of a height of the semiconductor laser element to be closer to the bottom thereof, and the optical isolator and the collective lens not only collect the laser beam emitted from the first output face of the active layer of the semiconductor laser element onto an incidence portion of the pumping optical fiber but also collect returning light reflected by the incidence portion of the pumping optical fiber onto a portion away from the bottom of the semiconductor laser element and closer to the laser holder.

In the optical transfer system of the invention, the active layer of the semiconductor laser element of the pump light source of the optical fiber amplifier is formed in the position away from the center of the height of the semiconductor laser element to be closer to the bottom thereof, and the optical isolator and the collective lens of the pump light source are disposed so as to collect the returning light reflected by the incidence portion of the optical fiber onto the portion away from the bottom of the semiconductor laser element and closer to the laser holder. Therefore, the returning light from the pumping optical fiber and pump light from a semiconductor laser element of another pump light source can be prevented from entering the output face of the semiconductor laser element. Accordingly, the problem that the light intensity detected by the photo detector of the pump light source is increased due to the returning light from the pumping optical fiber or the pump light from another semiconductor laser element can be avoided, and the output power of the semiconductor laser element of the pump light source of the optical fiber amplifier can be constantly controlled with ease. Also, since the semiconductor laser element of the pump light source can be prevented from being heated, the output power of the semiconductor laser element can be increased, resulting in improving the amplifying ability of the optical fiber amplifier.

BRIEF DESCRIPTION OF THE DRAWINGS

FIGS. 3(a) and 3(b) are diagrams for showing polarization directions of light in the semiconductor laser module of the first embodiment, wherein FIG. 3(a) shows the polarization directions of output light emitted by a semiconductor laser element and FIG. 3(b) shows the polarization directions of returning light reflected by an incidence portion of an optical fiber;

FIGS. 8(a) and 8(b) are diagrams for showing polarization directions of light in the semiconductor laser module of the second embodiment, wherein FIG. 8(a) shows the polarization directions of output light emitted by a semiconductor laser element and FIG. 8(b) shows the polarization directions of returning light reflected by an incidence portion of an optical fiber;

FIG. 16 is a diagram for showing the entire structure of an optical fiber amplifier according to a tenth embodiment;

FIGS. 17(a) and 17(b) are diagrams for showing polarization directions of light in the optical fiber amplifier of the tenth embodiment, wherein FIG. 17(a) shows the polarization directions of output light emitted by a semiconductor laser element and FIG. 17(b) shows the polarization directions of returning light reflected by an incidence portion of an optical fiber and the polarization directions of pump light emitted by another semiconductor laser element;

FIGS. 22(a) and 22(b) are diagrams for showing polarization directions of light in the semiconductor laser module of the first conventional example and an optical fiber amplifier according to a second conventional example, wherein FIG. 22(a) shows the polarization directions of output light emitted by a semiconductor laser element and FIG. 22(b) shows the polarization directions of returning light reflected by an incidence portion of an optical fiber and pump light emitted by another semiconductor laser element.

DETAILED DESCRIPTION OF THE INVENTION (Embodiment 1)

Figure 1:
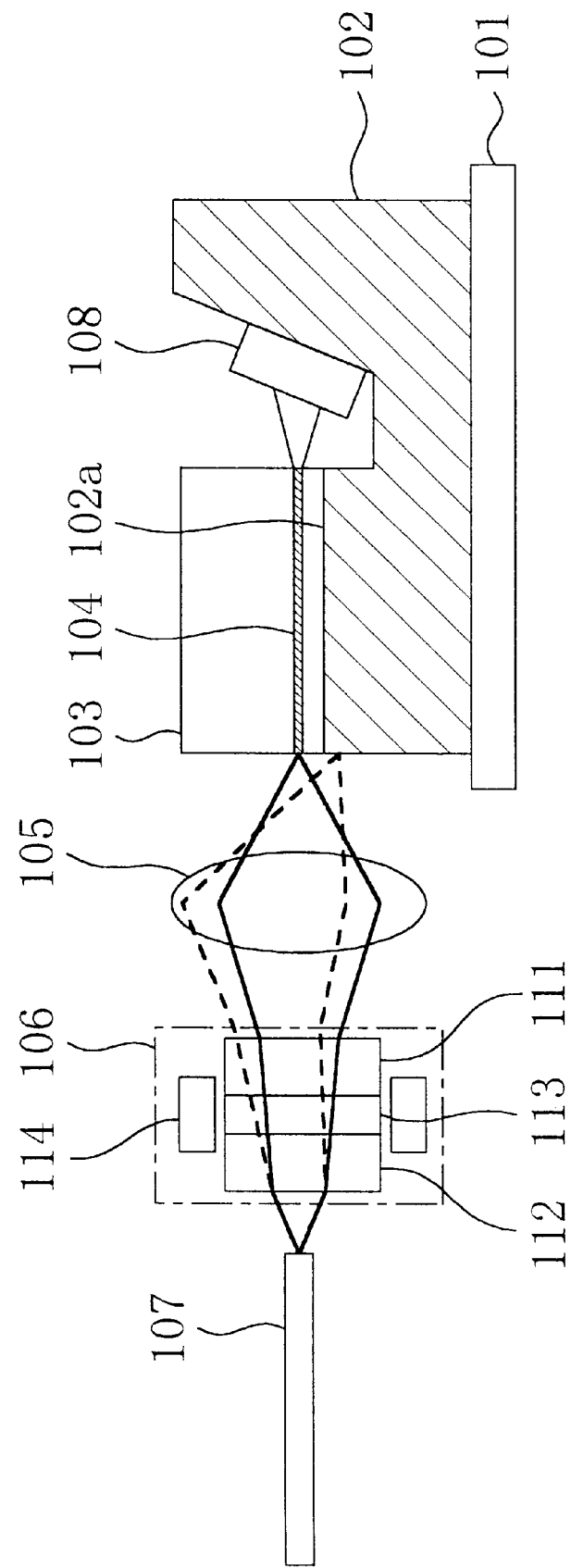
FIG. 1 is a sectional view of a semiconductor laser module according to a first embodiment of the invention.

FIG. 1 shows the sectional structure of a semiconductor laser module according to a first embodiment. As is shown in FIG. 1, on a Peltier element 101 disposed in a package not shown, a laser mount 102 working as a laser holder is provided. A semiconductor laser element 103 is fixed on the laser mount 102 with a soldering material having a thickness of approximately 1 µm.

As a characteristic of the first embodiment, an active layer 104 of the semiconductor laser element 103 is formed in a position away from the center of the height of the semiconductor laser element and closer to a bottom 102a of the semiconductor laser element 103, namely, closer to the laser mount 102. Specifically, a distance between the active layer 104 and the bottom 102a of the semiconductor laser element 103 is as small as 5 through 6 µm. Accordingly, heat generated in the active layer 104 of the semiconductor laser element 103 is transferred to the laser mount 102 through the area between the active layer 104 and the bottom 102a of the semiconductor laser element 103 with good heat conductivity and is then absorbed by the Peltier element 101. Therefore, even when a large amount of heat is generated in the active layer 104 as a result of increase of the output power of the semiconductor laser element 103, the increase of the output power of the semiconductor laser element 103 cannot be disturbed.

A laser beam emitted from the active layer 104 of the semiconductor laser element 103 in one direction (i.e., the leftward direction in FIG. 1) (whose optical path is shown with a solid line) is collected by a collective lens 105 so as to reach an optical isolator 106, passes through the optical isolator 106 and enters an incidence portion of an optical fiber 107. Returning light reflected by the incidence portion of the optical fiber 107 (whose optical path is shown with a broken line) passes through the optical isolator 106 and the collective lens 105 toward the semiconductor laser element 103. A laser beam emitted from the active layer 104 of the semiconductor laser element 103 in another direction (i.e., the rightward direction in FIG. 1) is detected for its light intensity by a monitor PD 108, and the detected light intensity is converted into a current signal to be used for controlling the output power of the semiconductor laser element 103.

Figure 2A:
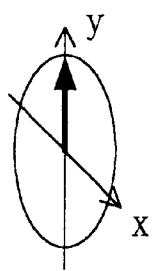
FIG. 2(a) shows a direction of an optical axis of a first rutile included in an optical isolator of the semiconductor laser module of the first embodiment.
Figure 2B:
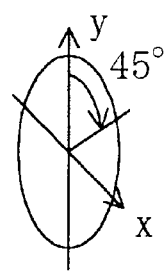
FIG. 2(b) shows a direction for rotating a polarization plane of light by a Faraday element included in the optical isolator and FIG. 2(c) shows a direction of an optical axis of a second rutile included in the optical isolator.
Figure 2C:
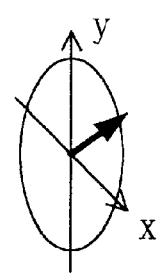

The optical isolator 106 includes, similarly to that of the first conventional example, a first rutile 111 working as a first doubly refracting crystal plate, a second rutile 112 working as a second doubly refracting crystal plate, a Faraday element 113 disposed between the first rutile 111 and the second rutile 112, and a permanent magnet 114 for applying a magnetic field to the Faraday element 113. The first rutile 111 and the second rutile 112 transmit light having a polarization plane parallel to their optical axes (abnormal light) with refraction and transmit light having a polarization plane perpendicular to their optical axes (normal light) without refraction. The Faraday element 113 transmits incident light with its polarization plane rotated in the clockwise direction by a predetermined angle, for example, by 45 degrees. FIG. 2(a) shows a direction of the optical axis of the first rutile 111 (the Y-axis positive direction), FIG. 2(b) shows the direction and the angle (the clockwise direction and 45 degrees) for rotating the polarization plane of incident light by the Faraday element 113, and FIG. 2(c) shows a direction of the optical axis of the second rutile 112 (a direction rotated from the Y-axis positive direction and the X-axis positive direction, respectively by 45 degrees). In the coordinate system used herein, a direction parallel to the surface of the active layer 104 of the semiconductor laser element 103 and perpendicular to a resonator corresponds to the X-axis, and a direction perpendicular to the surface of the active layer 104 corresponds to the Y-axis.

In FIG. 3(a), thick solid arrows show polarization directions of the output light emitted from the semiconductor laser element 103 in one direction toward the optical fiber 107. The arrow of (i) indicates the polarization direction immediately after it is emitted from the active layer 104 of the semiconductor laser element 103, the arrow of (ii) indicates the polarization direction when it passes through the collective lens 105, the arrow of (iii) indicates the polarization direction when it passes through the first rutile 111, the arrow of (iv) indicates the polarization direction when it passes through the Faraday element 113, the arrow of (v) indicates the polarization direction when it passes through the second rutile 112, and the arrow of (vi) indicates the polarization direction when it reaches the incidence portion of the optical fiber 107. In FIG. 3(b), thick solid arrows show polarization directions of the returning light reflected by the optical fiber 107. The arrow of (6) indicates the polarization direction immediately after it is reflected by the incidence portion of the optical fiber 107, the arrow of (5) indicates the polarization direction when it passes through the second rutile 112, the arrow of (4) indicates the polarization direction when it passes through the Faraday element 113, the arrow of (3) indicates the polarization direction when it passes through the first rutile 111, the arrow of (2) indicates the polarization direction when it passes through the collective lens 105, and the arrow of (1) indicates the polarization direction when it returns close to the semiconductor laser element 103.

In FIG. 3(a), the output light from the semiconductor laser element 103 is emitted in the TE mode having merely a polarization plane component parallel to the active layer 104 as is shown in (i), passes through the collective lens 105 with its polarization direction unchanged as is shown in (ii) and reaches the optical isolator 106. Since the light entering the optical isolator 106 is the normal light having the polarization direction perpendicular to the optical axis of the first rutile 111, the light passes through the first rutile 111 without refraction as is shown in (iii), and is rotated by 45 degrees in the clockwise direction by the Faraday element 113 as is shown in (iv). As a result, the light is changed to the normal light having the polarization direction perpendicular to the optical axis of the second rutile 112, and hence, the light passes through the second rutile 112 without refraction as is shown in (v) and reaches the optical fiber 117.

In FIG. 3(b), the light becomes the returning light by being reflected by the incidence portion of the optical fiber 107 with its polarization direction unchanged as is shown in (6), and the light is the normal light having the polarization direction perpendicular to the optical axis of the second rutile 112. Therefore, the light passes through the second rutile 112 without refraction as is shown in (5), and is rotated by 45 degrees by the Faraday element 113 as is shown in (4). As a result, the light is changed to the abnormal light having the polarization direction parallel to the optical axis of the first rutile 111, and hence, the light is refracted in the Y-axis positive direction by the first rutile 111 as is shown in (3). Then, the light passes through the collective lens 105 with being symmetrically projected in the vertical direction and the horizontal direction by the collective lens 105 as is shown in (2), and the resultant light is collected onto a collected portion moved from the output portion in the Y-axis negative direction as is shown in (1). A moving distance s from the output portion to the collected portion is represented by:

$$s=(d \times k)/m$$

wherein d indicates a thickness of the first rutile 111 and the second rutile 112, k indicates a moving coefficient of the optical axis and m indicates lens magnification.

In the optical isolator 106 of the first embodiment, d, k and m are set at 0.5 mm, +0.1 and 4.5, respectively, and hence, the moving distance s from the output portion to the collected portion is 11 $\mu$m. Since the moving distance s, i.e., 11 $\mu$m, is larger than a sum of the distance between the active layer 104 and the bottom 102a of the semiconductor laser element 103, i.e., 5 through 6 $\mu$m, and the thickness of the soldering material for fixing the semiconductor laser element 103, i.e., 1 $\mu$m. Therefore, the collected portion of the output light is disposed on the end face of the laser mount 102 as is shown in FIG. 1. Accordingly, the returning light reflected by the optical fiber 107 can be definitely avoided from entering the semiconductor laser element 103.

Now, results of an evaluation test for the semiconductor laser module of the first embodiment will be described. The evaluation test was carried out as follows: In one semiconductor laser module having the same rutile type optical isolator as that of the first embodiment, a semiconductor laser element having the same structure as that of the first embodiment and a wavelength of the 1.48 μm band was mounted, and in another semiconductor laser module of the same type, a semiconductor laser element having the same structure as that of the first conventional example and a wavelength of the 1.48 μm band was mounted. Laser beams emitted by these two semiconductor laser elements were used as the output light, and semiconductor laser beams in the wavelength of the 1.48 μm band emitted from the counter end (output end) of the optical fiber 107 were used as the returning light. Also, the transmittance of a coat on the end face of the semiconductor laser elements closer to the monitor PD was several %.

Figure 4:
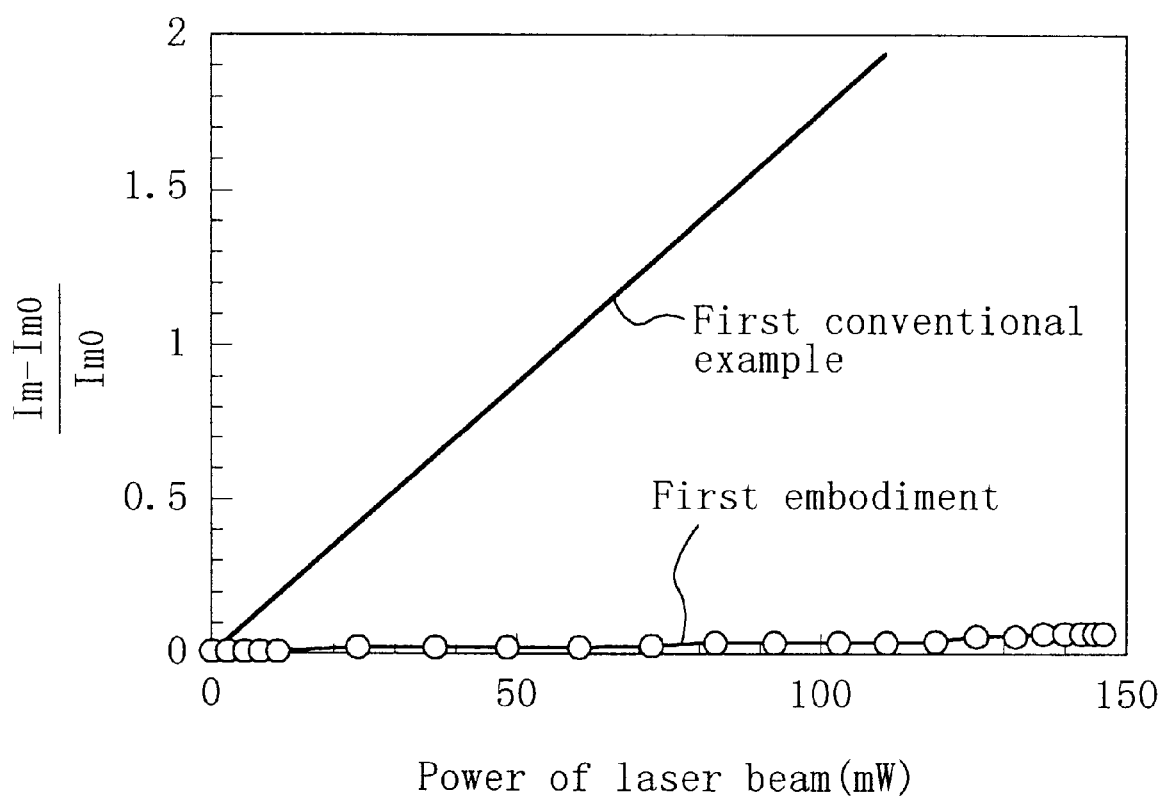
FIG. 4 is a characteristic diagram resulting from an evaluation test for the semiconductor laser module of the first embodiment for illustrating increase of a monitored current against a power of a laser beam of the returning light.

FIG. 4 shows increase of a monitored current against a power of the returning laser beam $(I_m-I_{m0})/I_{m0}$ (wherein $I_m$ corresponds to a monitored current obtained when the returning light is present, and $I_{m0}$ corresponds to a monitored current used as a standard obtained when the output light is emitted at 90 mW). As is obvious from FIG. 4, in the semiconductor laser module of the first conventional example, when a laser beam of approximately 50 mW externally enters as the returning light, the monitored current is increased by as much as 80%. In contrast, in the semiconductor laser module of the first embodiment, even when a laser beam of more than 100 mW enters as the returning light, the monitored current is increased as little as several %. In this manner, since the monitored current is scarcely affected by the returning light in the first embodiment, the output power of the semiconductor laser element can be stably controlled on the basis of the monitored current.

In the first embodiment, in the case where the portion below the active layer 104 of the semiconductor laser element 103 has a thickness larger than 5 through 6 μm, or in the case where the soldering material for fixing the semiconductor laser element 103 on the laser mount 102 has a larger thickness, the returning light can be collected onto and absorbed by the soldering material. Also, in the case where a heatsink is provided between the semiconductor laser element 103 and the laser mount 102, the returning light can be collected onto and absorbed by the heatsink.

Furthermore, the wavelength of the laser beam emitted by the semiconductor laser element 103 built in the semiconductor laser module of the first embodiment is not herein specified, and the same effects can be attained with the wavelengths of 1.48 μm, 1.3 μm and 1.55 μm.

Figure 5:
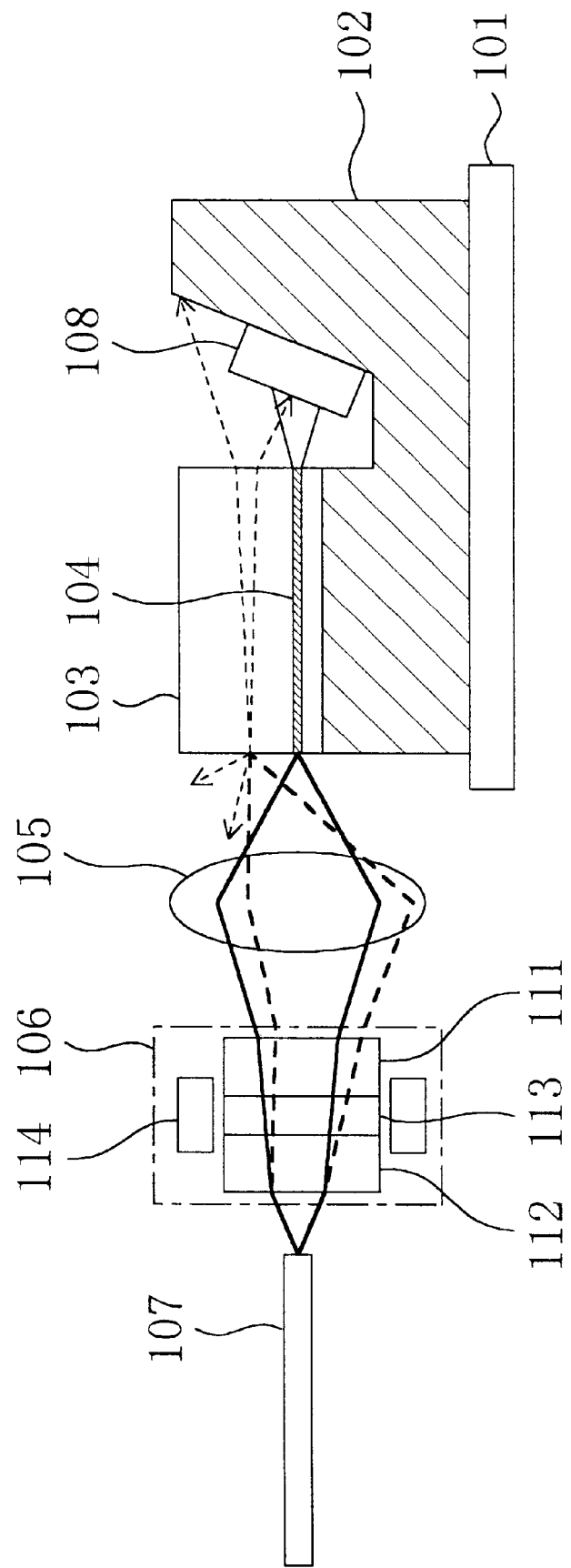
FIG. 5 is a sectional view of a semiconductor laser module for showing a premise of the present invention.

In the first embodiment, the active layer 104 of the semiconductor laser element 103 is formed to be positioned away from the center of the height of the semiconductor laser element 103 to be closer to the bottom 102a, and the output light emitted from the active layer 104 is collected onto the position closer to the laser mount 102 than to the semiconductor laser element 103 by using the optical isolator 106 and the collective lens 105. As a result, the conductance of the heat generated in the active layer 104 can be improved as well as the increase of the monitored current derived from the returning light can be avoided. Even when the active layer 104 of the semiconductor element 103 is formed at a position away from the center of the height of the semiconductor element 103 to be closer to the bottom 102a, if the output light emitted from the active layer 104 is collected onto the other side of the active layer 104 of the semiconductor laser element 103 farther from the laser mount 102 by using the optical isolator 106 and the collective lens 105, for example, as is shown in FIG. 5, the returning light is divided into a component reflected by the output face of the semiconductor laser element 103 and a component passing through the semiconductor laser element 103. As a result, the intensity of light entering the monitor PD 108 can be increased due to the component passing through the semiconductor laser element 103.

(Embodiment 2)

Figure 6:
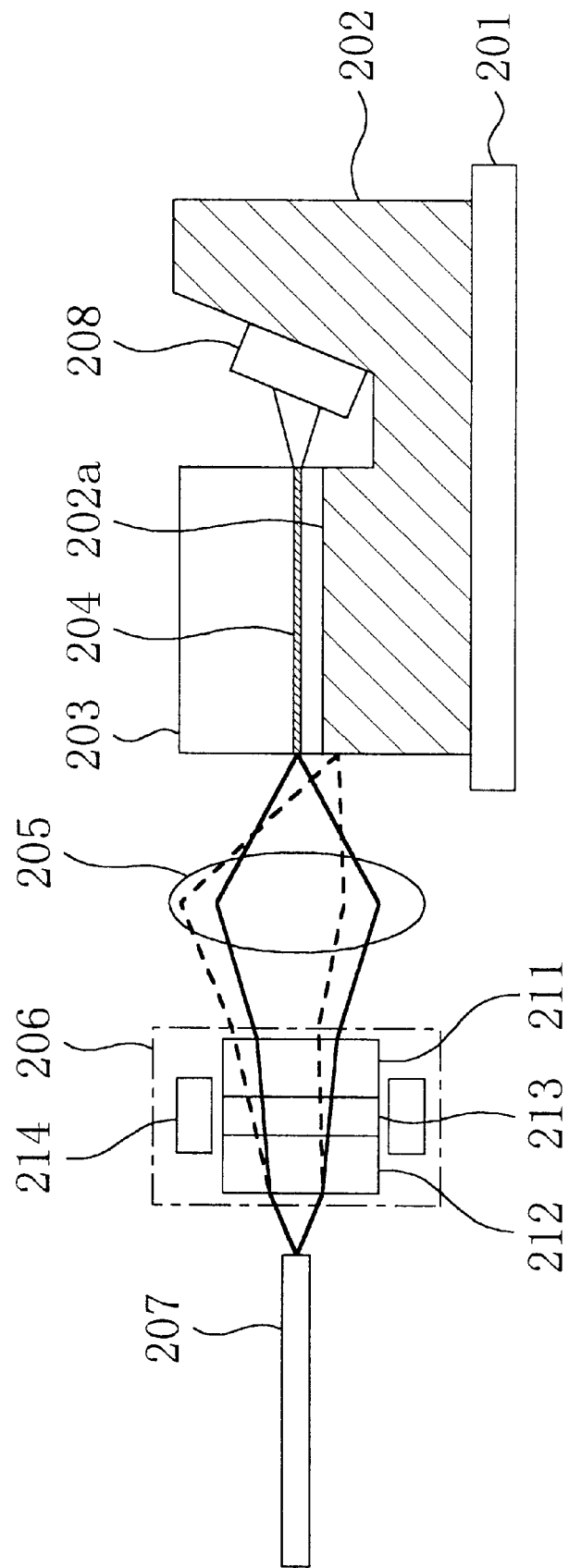
FIG. 6 is a sectional view of a semiconductor laser module according to a second embodiment of the invention.

FIG. 6 shows the sectional structure of a semiconductor laser module according to a second embodiment. As is shown in FIG. 6, on a Peltier element 201 disposed in a package not shown, a laser mount 202 is provided, and a semiconductor laser element 203 is fixed on the laser mount 202 with a soldering material with a thickness of approximately 1 μm. As a characteristic of the second embodiment, an active layer 204 of the semiconductor laser element 203 is formed in a position away from the center of the height of the semiconductor laser element 203 to be closer to a bottom 202a. Specifically, a distance between the active layer 204 and the bottom 202a of the semiconductor laser element 203 is as small as 5 through 6 μm. Accordingly, heat generated in the active layer 204 of the semiconductor laser element 203 is transferred through the area between the active layer 204 and the bottom 202a of the semiconductor laser element 203 with good heat conductance in the same manner as in the first embodiment. As a result, even when a large amount of heat is generated in the active layer 204 due to the output power increase of the semiconductor laser element 203, the output power increase of the semiconductor laser element 203 cannot be disturbed.

A laser beam emitted from the active layer 204 of the semiconductor laser element 203 in one direction (i.e., in the leftward direction in FIG. 6) (whose optical path is shown with a solid line) is collected by a collective lens 205 so as to reach an optical isolator 206, passes through the optical isolator 206 and enters an incidence portion of an optical fiber 207. Returning light reflected by the incidence portion of the optical fiber 207 (whose optical path is shown with a broken line) passes through the optical isolator 206 and the collective lens 205 so as to proceed close to the semiconductor laser element 203. A laser beam emitted from the active layer 204 of the semiconductor laser element 203 in another direction (i.e., the rightward direction in FIG. 6) is detected for its light intensity by a monitor PD 208, and the detected light intensity is converted into a current signal to be used for controlling the output power of the semiconductor laser element 203.

Figure 7A:
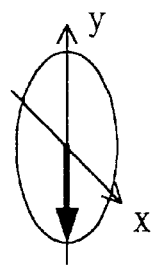
FIG. 7(a) shows a direction of an optical axis of a first calcite included in an optical isolator of the semiconductor laser module of the second embodiment.
Figure 7B:
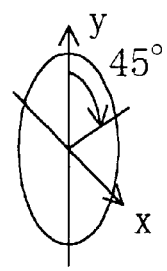
FIG. 7(b) shows a direction for rotating a polarization plane of light by a Faraday element included in the optical isolator and FIG. 7(c) shows a direction of an optical axis of a second calcite included in the optical isolator.
Figure 7C:
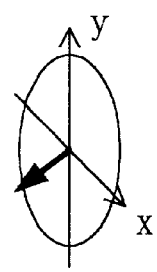

The optical isolator 206 includes a first calcite 211, that is, a negative crystal plate working as a first doubly refracting crystal plate, a second calcite 212, that is, a negative crystal plate working as a second doubly refracting crystal plate, a Faraday element 213 disposed between the first calcite 211 and the second calcite 212, and a permanent magnet 214 for applying a magnetic field to the Faraday element 213. The first calcite 211 and the second calcite 212 transmit light having a polarization plane parallel to their optical axes (abnormal light) with refraction and transmit light having a polarization plane perpendicular to their optical axes (normal light) without refraction. The Faraday element 213 transmits incident light with its polarization plane rotated always in the clockwise direction by a predetermined angle, for example, 45 degrees. FIG. 7(*a*) shows a direction of the optical axis of the first calcite 211 (the Y-axis negative direction), FIG. 7(*b*) shows the direction and the angle (the clockwise direction and 45 degrees) for rotating the polarization plane of incident light by the Faraday element 213, and FIG. 7(c) shows a direction of the optical axis of the second calcite 212 (a direction rotated from the Y-axis negative direction and the X-axis negative direction, respectively by 45 degrees).

Figure 8A:
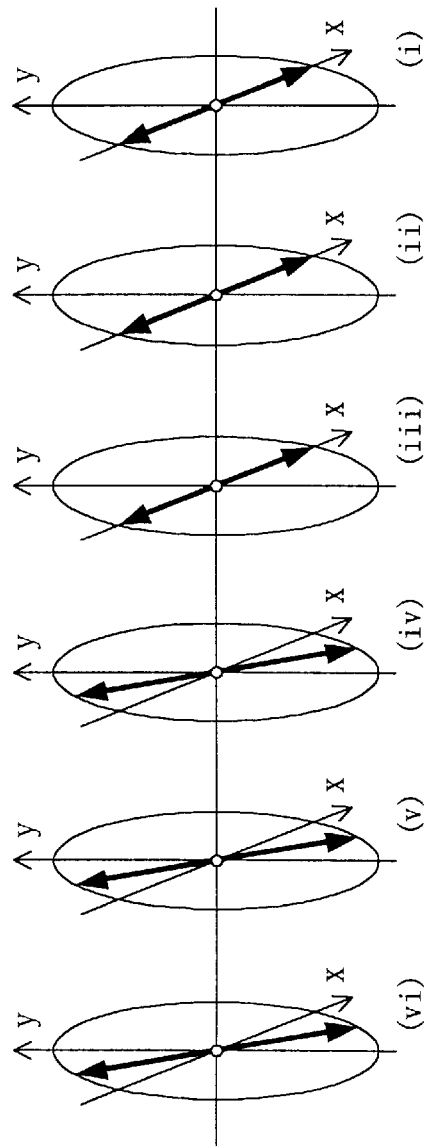
Figure 8B:
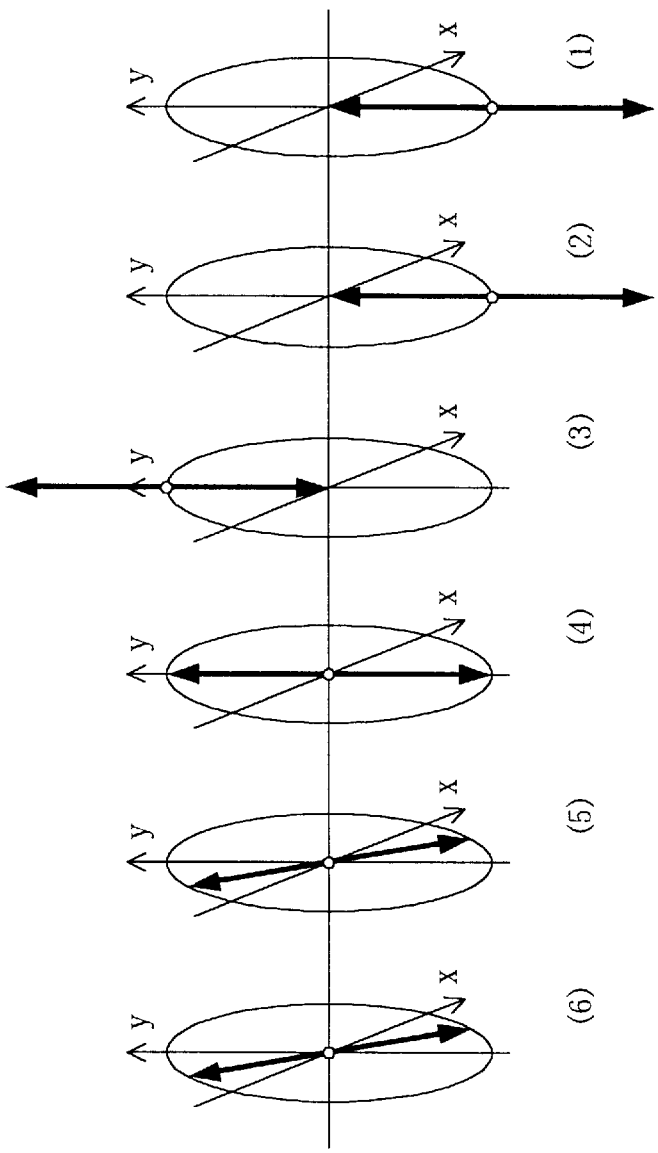

In FIG. 8(a), thick solid arrows indicate polarization directions of the output light emitted from the semiconductor laser element 203 in one direction toward the optical fiber 207. The arrow of (i) indicates the polarization direction immediately after it is emitted from the active layer 204 of the semiconductor laser element 203, the arrow of (ii) indicates the polarization direction when it passes through the collective lens 205, the arrow of (iii) indicates the polarization direction when it passes through the first calcite 211, the arrow of (iv) indicates the polarization direction when it passes through the Faraday element 213, the arrow of (v) indicates the polarization direction when it passes through the second calcite 212, and the arrow of (vi) indicates the polarization direction when it reaches the incidence portion of the optical fiber 207. In FIG. 8(b), thick solid arrows indicate polarization directions of the returning light reflected by the optical fiber 207. The arrow of (6) indicates the polarization direction immediate after it is reflected by the incidence portion of the optical fiber 207, the arrow of (5) indicates the polarization direction when it passes through the second calcite 212, the arrow of (4) indicates the polarization direction when it passes through the Faraday element 213, the arrow of (3) indicates the polarization direction when it passes through the first calcite 211, the arrow of (2) indicates the polarization direction when it passes through the collective lens 205, and the arrow of (1) indicates the polarization direction when it returns close to the semiconductor laser element 203.

In FIG. 8(a), the output light from the semiconductor laser element 203 is emitted in the TE mode having merely a polarization plane component parallel to the active layer 204 as is shown in (i), and passes through the collective lens 205 with its polarization direction unchanged as is shown in (ii) to reach the optical isolator 206. Since the light entering the optical isolator 206 is the normal light having the polarization direction perpendicular to the optical axis of the first calcite 211, it passes through the first calcite 211 without refraction as is shown in (iii), and is rotated in the clockwise direction by 45 degrees by the Faraday element 213 as is shown in (iv). As a result, the light is changed to the normal light having the polarization direction perpendicular to the optical axis of the second calcite 212, and hence, it passes through the second calcite 212 without refraction as is shown in (v) and reaches the optical fiber 217.

In FIG. 8(b), the light becomes the returning light by being reflected by the incidence portion of the optical fiber 207 with its polarization direction unchanged as is shown in (6), and since the light is the normal light having the polarization direction perpendicular to the optical axis of the second calcite 212, it passes through the second calcite 212 without refraction as is shown in (5), and is rotated in the clockwise direction by 45 degrees by the Faraday element 213 as is shown in (4). As a result, the light is changed to the abnormal light having the polarization direction parallel to the optical axis of the first calcite 211, and hence, it is refracted in the Y-axis positive direction by the first calcite 211 as is shown in (3), and passes through the collective lens 205 with being symmetrically projected in the vertical direction and the horizontal direction by the collective lens 205 as is shown in (2). Then, the light returns to a collected portion moved from the output portion in the Y-axis negative direction as is shown in (1). A moving distance s from the output portion to the collected portion is represented by:

$$s=(d \times k)/m$$

wherein d indicates a thickness of the first calcite 211 and the second calcite 212, k indicates a moving coefficient of the optical axis, and m indicates lens magnification.

In the optical isolator 206 of the second embodiment, d, k and m are set at 0.5 mm, −0.1 and 4.5, and hence, the moving distance s from the output portion to the collected portion is 11 $\mu$m. The moving distance, that is, 11 $\mu$m, is larger than a sum of the distance between the active layer 204 and the bottom 202a of the semiconductor laser element 203, that is, 5 through 6 $\mu$m, and the thickness of the soldering material for fixing the semiconductor laser element 203, that is, 1 $\mu$m. Therefore, the collected portion is positioned on the end face of the laser mount 202 as is shown in FIG. 6. Accordingly, the returning light reflected by the optical fiber 207 can be definitely prevented from entering the semiconductor laser element 203.

In the second embodiment, in the case where the distance between the active layer 204 and the bottom 202a of the semiconductor laser element 203 is larger than 5 through 6 $\mu$m, or in the case where the soldering material for fixing the semiconductor laser element 203 on the laser mount 202 has a larger thickness, the returning light can be collected onto and absorbed by the soldering material. Also, in the case where a heatsink is provided between the semiconductor laser element 203 and the laser mount 202, the returning light can be collected onto and absorbed by the heatsink.

Furthermore, the wavelength of the laser beam emitted by the semiconductor laser element 203 built in the semiconductor laser module of the second embodiment is not herein specified, and the same results can be attained with wavelengths of 1.48 $\mu$m, 1.3 $\mu$m and 1.55 $\mu$m.

(Embodiment 3)

Figure 9:
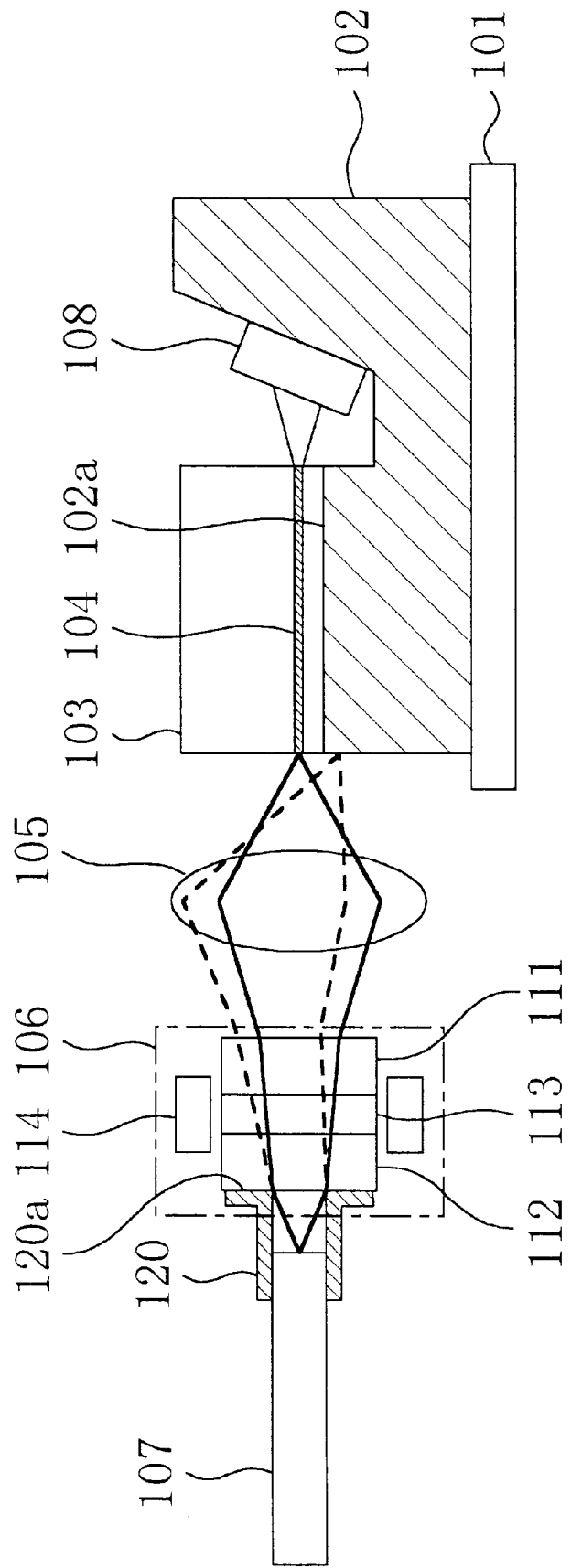
FIG. 9 is a sectional view of a semiconductor laser module according to a third embodiment.

FIG. 9 shows the sectional structure of a semiconductor laser module according to a third embodiment. As is shown in FIG. 9, the semiconductor laser module of the third embodiment is identical in its structure to that of the first embodiment except that an optical isolator 106 and an optical fiber 107 are fixed to and integrated with each other. Therefore, like reference numerals are used to refer to like elements and the description is omitted.

As a characteristic of the third embodiment, the incidence portion of the optical fiber 107 is fit in a fiber holder 120 having a flange 120a and the flange 120a of the fiber holder 120 is fixed on a second rutile 112 of the optical isolator 106.

Since the optical isolator 106 has been decreased in its size in accordance with downsizing of a semiconductor laser module, it has become difficult to adjust the polarization direction of the optical isolator 106 with the polarization plane of a laser beam emitted from a semiconductor laser element 103. However, when the optical isolator 106 and the optical fiber 107 are integrated as in the third embodiment, the polarization direction of the optical isolator 106 can be easily adjusted with the polarization plane of a laser beam emitted from the semiconductor laser element 103. Also, since a distance between the incident end of the optical fiber 107 and the optical isolator 106 can be thus made constant, the beam diameter of the laser beam can be made constant within the optical isolator 106 and the laser beam can be allowed to pass through the center of the optical isolator 106. As a result, the diameter of the optical isolator 106 can be minimized.

(Embodiment 4)

Figure 10:
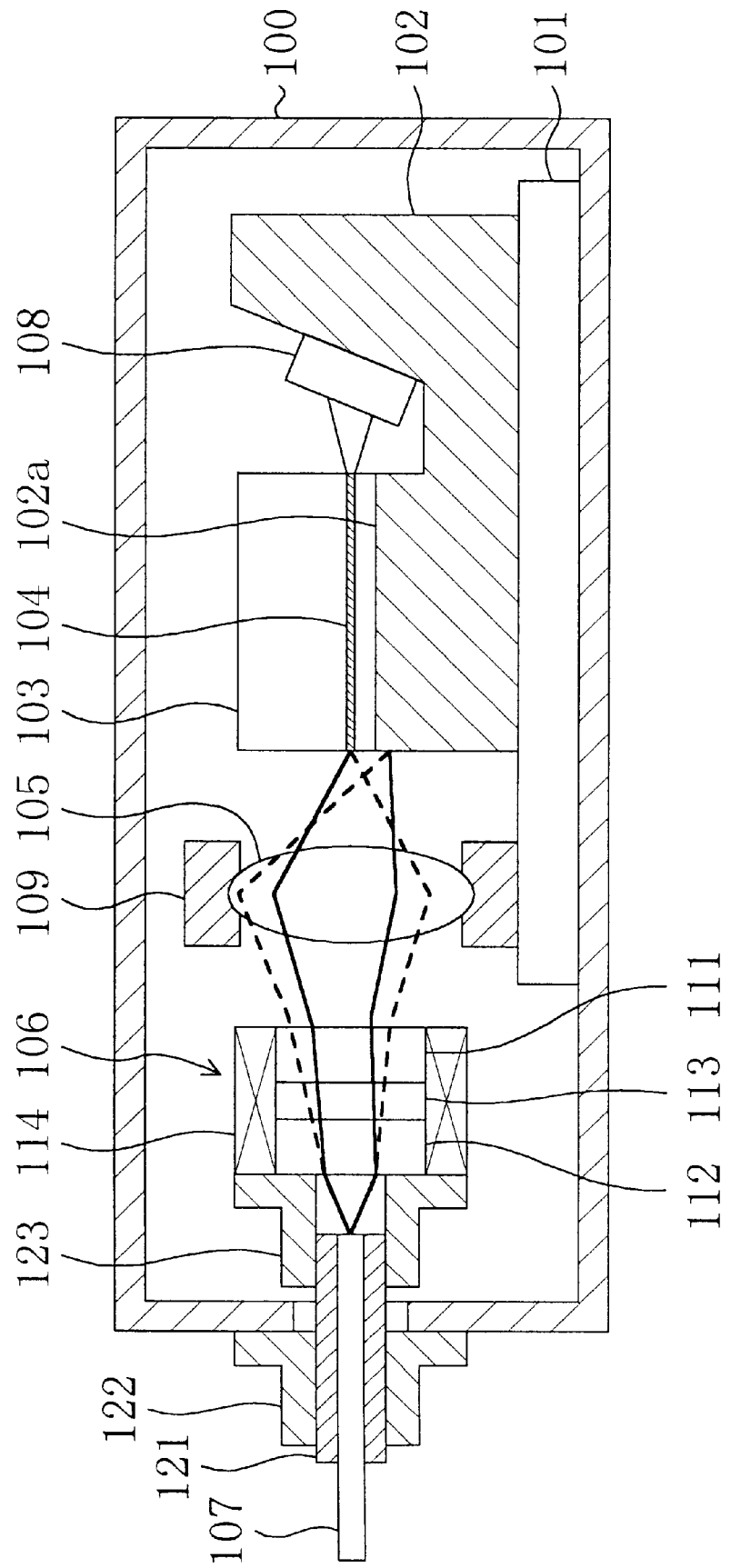
FIG. 10 is a sectional view of a semiconductor laser module according to a fourth embodiment.

FIG. 10 shows the sectional structure of a semiconductor laser module according to a fourth embodiment. As is shown in FIG. 10, the semiconductor laser module of the fourth embodiment is identical in its structure to that of the first embodiment except that a package 100 is provided and that an optical isolator 106 and an optical fiber 107 are integrated with each other. Therefore, like reference numerals.are used to refer to like elements, and the description is omitted.

As is shown in FIG. 10, a Peltier element 101 is fixed on the bottom of the package 100 with a soldering material, and a laser mount 102 and a ring-shaped lens holder 109 for holding a collective lens 105 are fixed on the top face of the Peltier element 101.

As a characteristic of the fourth embodiment, the incidence portion of the optical fiber 107 is fit in a ferrule 121 penetrating through the side wall of the package 100 at the output side, and the ferrule 121 is fixed in a fiber holder 122 having a flange. Also, the flange of the fiber holder 122 is fixed on the outer surface of the side wall of the package 100 at the output side. The end of the ferrule 121 closer to the optical isolator 106 is fit in an isolator holder 123 having a flange, and the optical isolator 106 is fixed on the flange of the isolator holder 123. In this manner, the optical isolator 106 and the optical fiber 107 are integrated with each other, resulting attain the same effects as those of the third embodiment.

(Embodiment 5)

Figure 11:
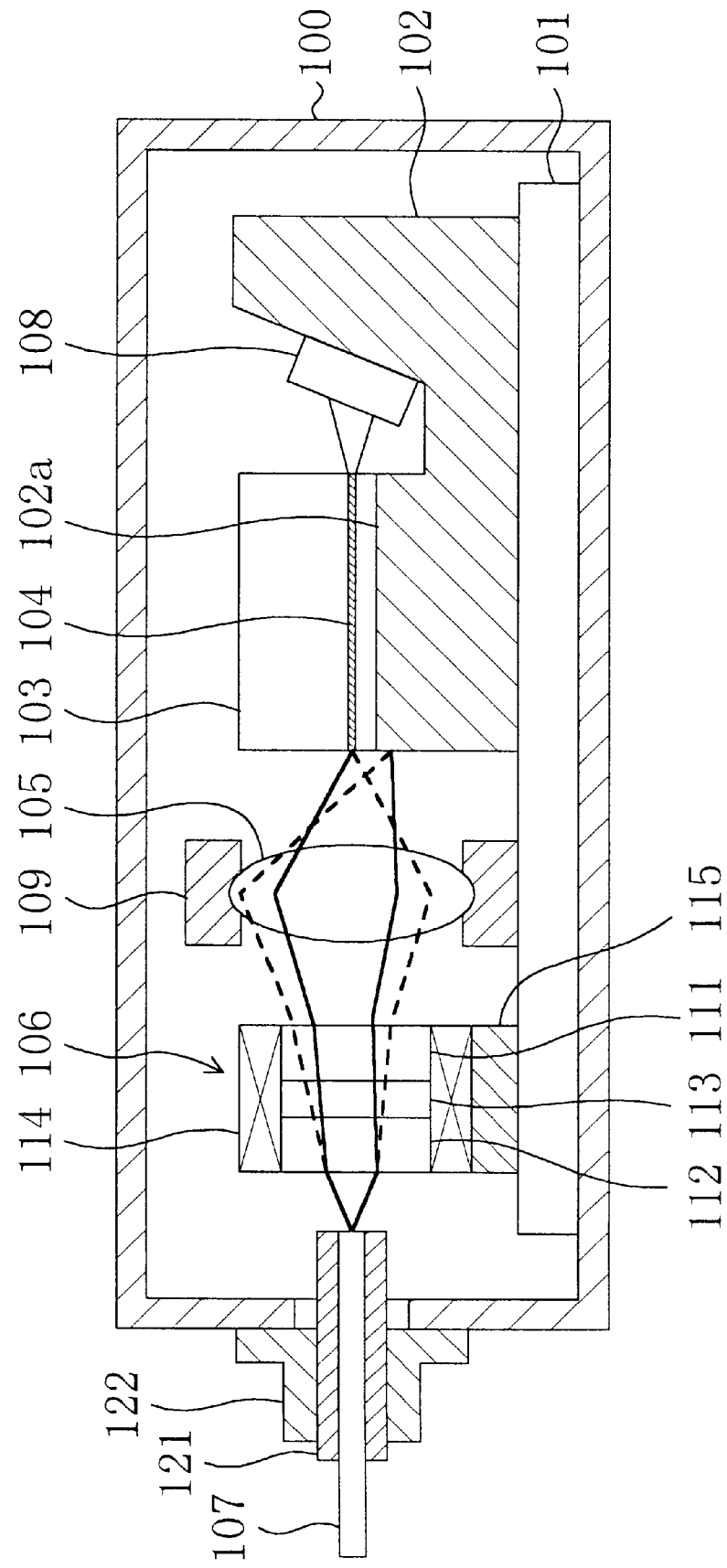
FIG. 11 is a sectional view of a semiconductor laser module according to a fifth embodiment.

FIG. 11 shows the sectional structure of a semiconductor laser module according to a fifth embodiment. As is shown in FIG. 11, the semiconductor laser module of the fifth embodiment is identical in its structure to that of the first embodiment except that a package 100 is provided and that an optical isolator 106 and an optical fiber 107 are integrated with each other. Therefore, like reference numerals are used to refer to like elements, and the description is omitted.

As is shown in FIG. 11, a Peltier element 101 is fixed on the bottom of the package 100 with a soldering material, and a laser mount 102 and a ring-shaped lens holder 109 for holding a collective lens 105 are fixed on the top face of the Peltier element 101.

As a characteristic of the fifth embodiment, the optical isolator 106 is held by an isolator holder 115 fixed on the top face of the Peltier element 101. Also, the incidence portion of the optical fiber 107 is fit in a ferrule 121 penetrating through the side wall of the package 100 at the output side, and the ferrule 121 is fixed in a fiber holder 122 having a flange. In this manner, the optical isolator 106 and the optical fiber 107 are integrated with each other through the package 100, and hence, the same effects as those of the third embodiment can be attained.

(Embodiment 6)

Figure 12:
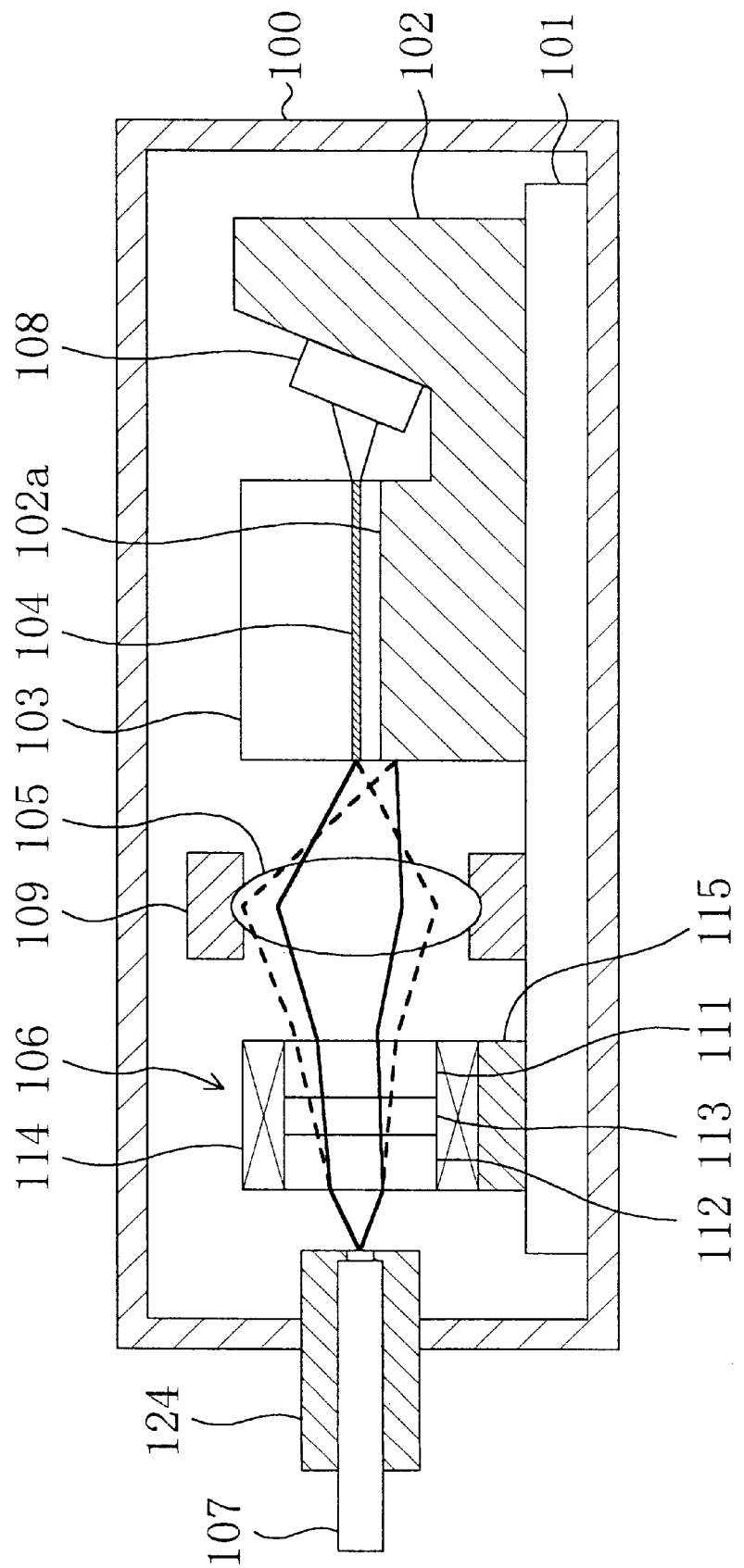
FIG. 12 is a sectional view of a semiconductor laser module according to a sixth embodiment.

FIG. 12 shows the sectional structure of a semiconductor laser module according to a sixth embodiment. As is shown in FIG. 12, the semiconductor laser module of the sixth embodiment is identical in its structure to that of the first embodiment except that a package 100 is provided and that an optical isolator 106 and an optical fiber 107 are integrated with each other. Therefore, like reference numerals are used to refer to like elements, and the description is omitted.

As is shown in FIG. 12, a Peltier element 101 is fixed on the bottom of the package 100 with a soldering material, and a laser mount 102 and a ring-shaped lens holder 109 for holding a collective lens 105 are fixed on the top face of the Peltier element 101.

As a characteristic of the sixth embodiment, the optical isolator 106 is held by an isolator holder 115 fixed on the top face of the Peltier element 101. Also, the incidence portion of the optical fiber 107 is fit in a receptacle type fiber holder 124, which penetrates through and is fixed on the side wall of the package 100 at the output side. In this manner, the optical isolator 106 and the optical fiber 107 are integrated with each other through the package 100, resulting in attaining the same effects as those of the third embodiment.

(Embodiment 7)

Figure 13:
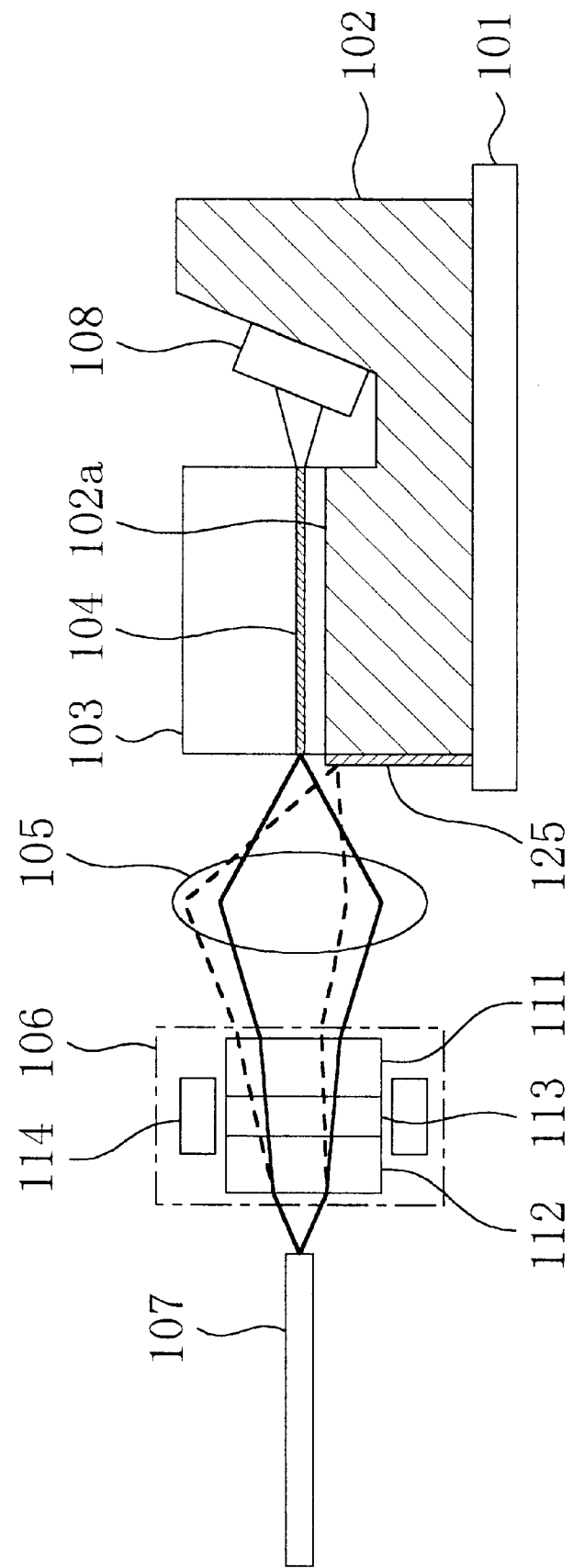
FIG. 13 is a sectional view of a semiconductor laser module according to a seventh embodiment.

FIG. 13 shows the sectional structure of a semiconductor laser module according to a seventh embodiment. As a characteristic of the seventh embodiment, an antireflection coating 125 is provided on the end face of a laser mount 102 facing an optical fiber 107. Except for the antireflection coating 125 provided on the laser mount 102, the semiconductor laser module of the seventh embodiment is identical in its structure to that of the first embodiment. Therefore, like reference numerals are used to refer to like elements, and the description is omitted.

As the antireflection coating 125, any film having a light absorbing characteristic in the wavelength band of a laser beam, such as a metal film, a dielectric multilayered film, a resin film and a paint film, can be appropriately used.

Since the antireflection coating 125 is provided on the end face of the laser mount 102 facing the optical fiber 107 in the semiconductor laser module of the seventh embodiment, the returning light collected onto the end face of the laser mount 102 is not reflected by the end face of the laser mount 102. Accordingly, it is possible to prevent light reflected by the end face of the laser mount 102 from becoming stray light within the package 100 as is shown in FIGS. 10 through 12 to be detected by a monitor PD 108. From this point of view, it is possible to more definitely avoid stray light from being caused in the package 100 by providing the antireflection coating 125 not only on the end face of the laser mount 102 but also on the end face of the lens holder 102 of FIG. 11 or 12 facing the optical fiber 107, on the surface of a holding frame of the lens opposing the inside wall of the package 100 and on the inside wall of the package 100. In particular, when the semiconductor laser module is used for communication, increase of noise and degradation in a distortion characteristic derived from reflecting light can be suppressed.

(Embodiment 8)

Figure 14:
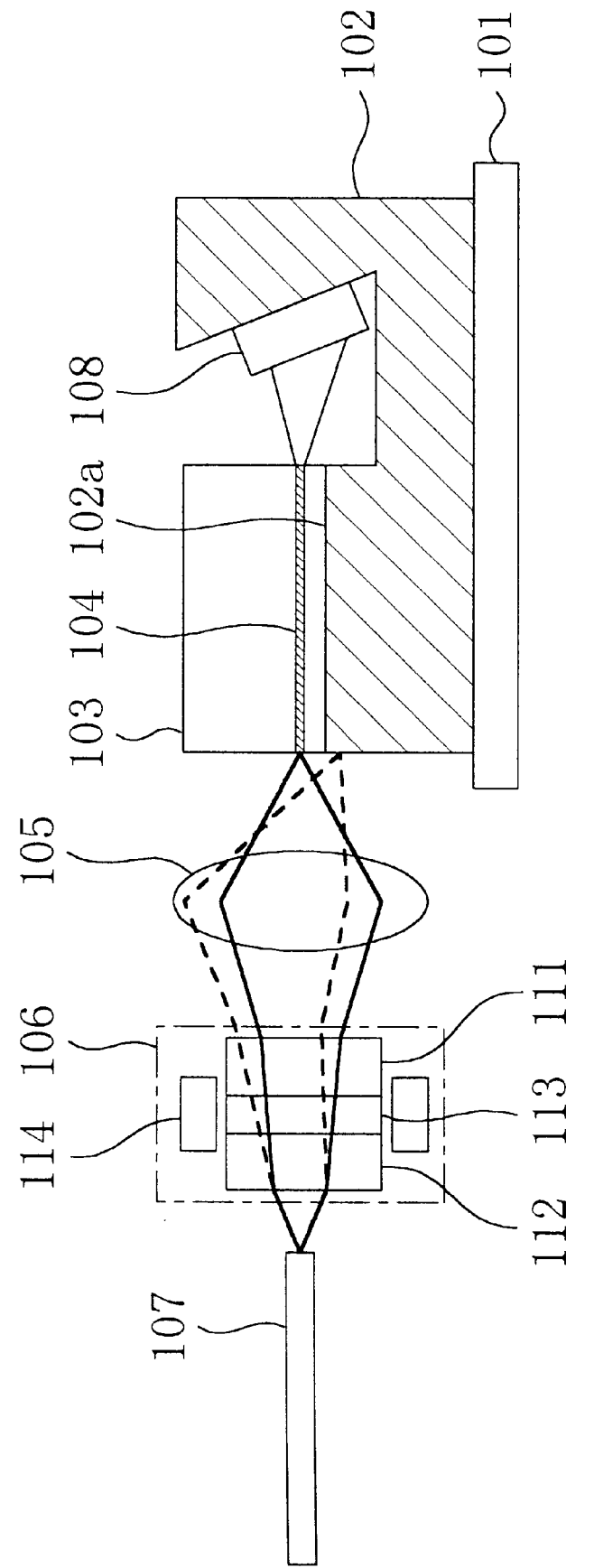
FIG. 14 is a sectional view of a semiconductor laser module according to an eighth embodiment.

FIG. 14 shows the sectional structure of a semiconductor laser module according to an eighth embodiment. As a characteristic of the eighth embodiment, a monitor PD 108 is fixed on a laser mount 102 so that its detection surface faces the bottom of a package 100 of FIG. 10, 11 or 12. Except for the detection surface of the monitor PD 108 facing the bottom of the package 100, the semiconductor laser module of this embodiment is identical in its structure to that of the first embodiment. Therefore, like reference numerals are used to refer to like elements, and the description is omitted.

Since the detection face of the monitor PD 108 of the semiconductor laser module of the eighth embodiment faces the bottom of the package 100, less stray light in the package 100 can be detected by the monitor PD 108.

(Embodiment 9)

Figure 15:
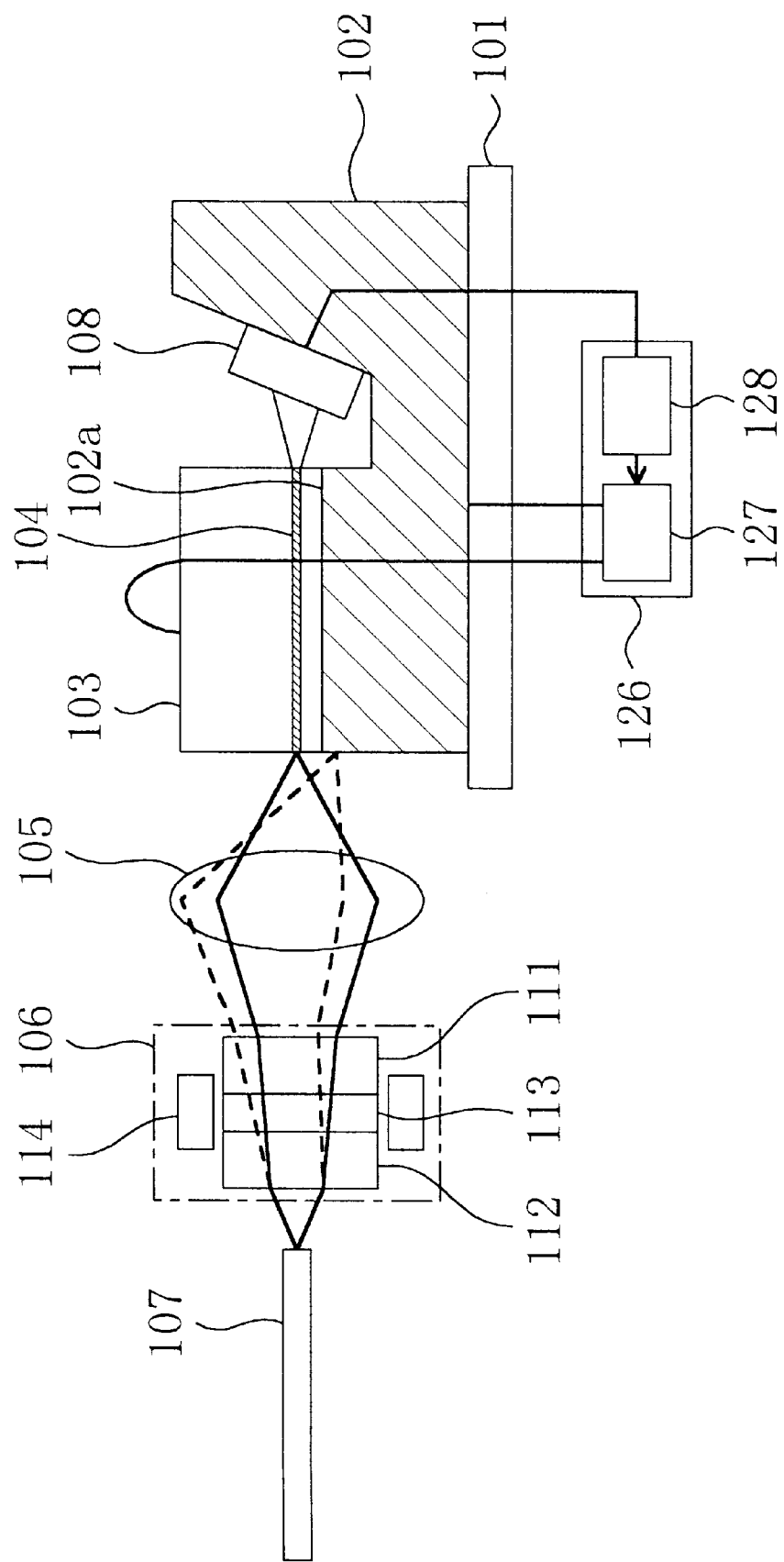
FIG. 15 is a sectional view of a semiconductor laser module according to a ninth embodiment.

FIG. 15 shows the sectional structure of a semiconductor laser module according to a ninth embodiment. As a characteristic of the ninth embodiment, the semiconductor laser module is additionally provided with an output stabilizing device 126 for controlling a current to be injected into a semiconductor laser element 103 on the basis of an output signal of a monitor PD 108. Except for the output stabilizing device 126, the semiconductor laser module of the ninth embodiment is identical in its structure to that of the first embodiment. Therefore, like reference numerals are used to refer to like elements, and the description is omitted.

The output stabilizing device 126 includes a current source 127 for applying a predetermined current to the semiconductor laser element 103 and a control unit 128 for detecting a monitored current output by the monitor PD 108 and outputting a control signal, to the current source 127, for controlling an amplitude of the current applied to the semiconductor laser element 103 by the current source 127 on the basis of the detected monitored current. Since the semiconductor laser module of the ninth embodiment is thus provided with the output stabilizing device 126, even when the intensity of a laser beam emitted by the semiconductor laser element 103 is varied with time or due to temperature change, the intensity of the laser beam emitted by the semiconductor laser element 103 can be constantly controlled on the basis of the monitored current output by the monitor PD 108. As a result, an optical fiber 107 can attain stable light output power.

(Embodiment 10)

FIG. 16 shows the entire structure of an optical fiber amplifier with high output power according to a tenth embodiment. As is shown in FIG. 16, the optical fiber amplifier includes an amplification optical fiber 300 doped with rare earth ions such as erbium ions, a first semiconductor laser pump light source 301 and a second semiconductor laser pump light source 302. First pump light emitted by the first semiconductor laser pump light source 301 enters the amplification optical fiber 300 through a first coupler 303, and second pump light emitted by the second semiconductor laser pump light source 302 enters the amplification optical fiber 300 through a second coupler 304, so as to pump the erbium ions included in the amplification optical fiber 300. Also, a first amplification optical isolator 305 is provided in the amplification optical fiber 300 to be closer to an incidence portion 300a than the first coupler 303, and a second amplification optical isolator 306 is provided in the amplification optical fiber 300 to be closer to an output portion 300b than the second coupler 303, so that the first and second amplification optical isolators 305 and 306 can prevent degradation in a noise characteristic and a distortion characteristic of the optical fiber amplifier. Owing to the aforementioned structure, an output signal having entered the incidence portion 300a of the amplification optical fiber 300 is amplified while passing through the amplification optical fiber 300 so as to be output from the output portion 300b.

As the first and second semiconductor laser pump light sources 301 and 302, any of the semiconductor laser modules according to the first through ninth embodiments can be appropriately used. Now, description will be given on the application of the semiconductor laser module of the first embodiment.

Figure 17A:
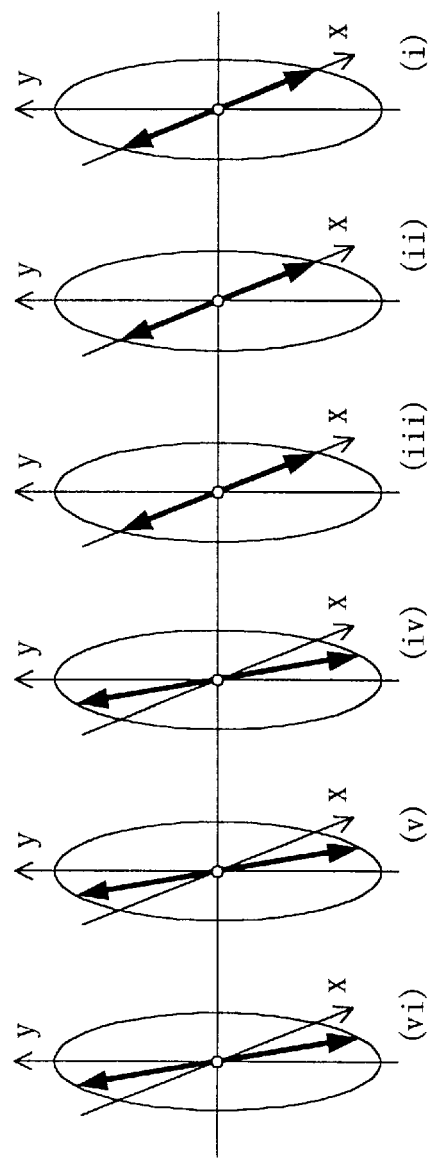

In FIG. 17(a), thick solid arrows indicate polarization directions of output light emitted by the semiconductor laser element 103 of the semiconductor laser module used as the first or second semiconductor laser pump light source 301 or 302 toward the incidence portion of the optical fiber 107 of the semiconductor laser module. The arrows of (i) through (vi) are not described at this point because these arrows are the same as those of (i) through (vi) of FIG. 3(a).

Figure 17B:
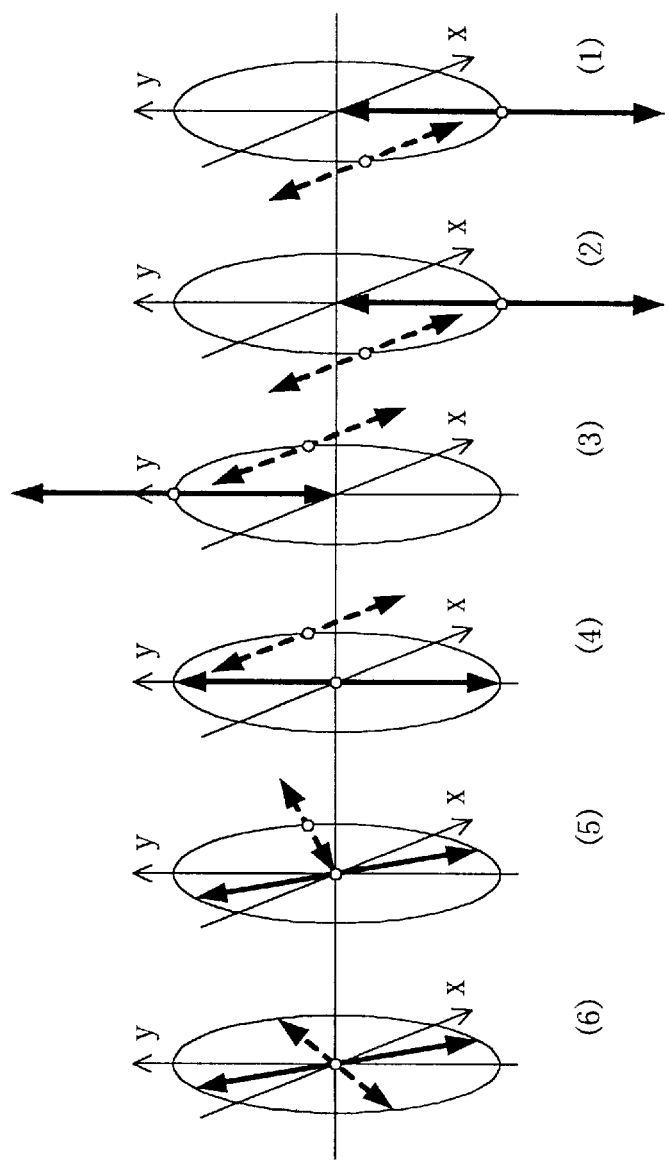

In FIG. 17(b), thick solid arrows indicate polarization directions of returning light emitted by the semiconductor laser element 103 and reflected by the incidence portion of the optical fiber 107, and thick solid arrows and thick broken arrows indicate polarization directions of pump light emitted by a first semiconductor laser element of the semiconductor laser source used as one of the first and second semiconductor laser pump light sources 301 and 302 toward a second semiconductor laser element of the other of the first and second semiconductor laser pump light sources 301 and 302.

The polarization directions shown with the thick solid arrows of (6) through (1) of FIG. 17(b) are not described at this point because these arrows are the same as those of (6) through (1) of FIG. 3(b), and merely the polarization directions of light having polarization components shown with the thick broken arrows of (6) through (1) of FIG. 17(b) will now be described. The light having the polarization direction as is shown in (6) is the abnormal light having the polarization direction parallel to the optical axis of the second rutile 112, and hence is refracted in the direction between the X-axis positive direction and the Y-axis positive direction by the second rutile 112 as is shown in (5) and is rotated by 45 degrees in the clockwise direction by the Faraday element 113 as is shown in (4). As a result, the light is changed to the normal light having the polarization direction perpendicular to the optical axis of the first rutile 111, and hence, passes through the first rutile 111 without refraction as is shown in (3). Then, the light passes through the collective lens 105 with being symmetrically projected in the vertical direction and the horizontal direction by the collective lens 105 as is shown in (2) and is collected onto the collected portion moved from the active layer 104 in the direction between the X-axis negative direction and the Y-axis negative direction as is shown in (1).

Figure 18:
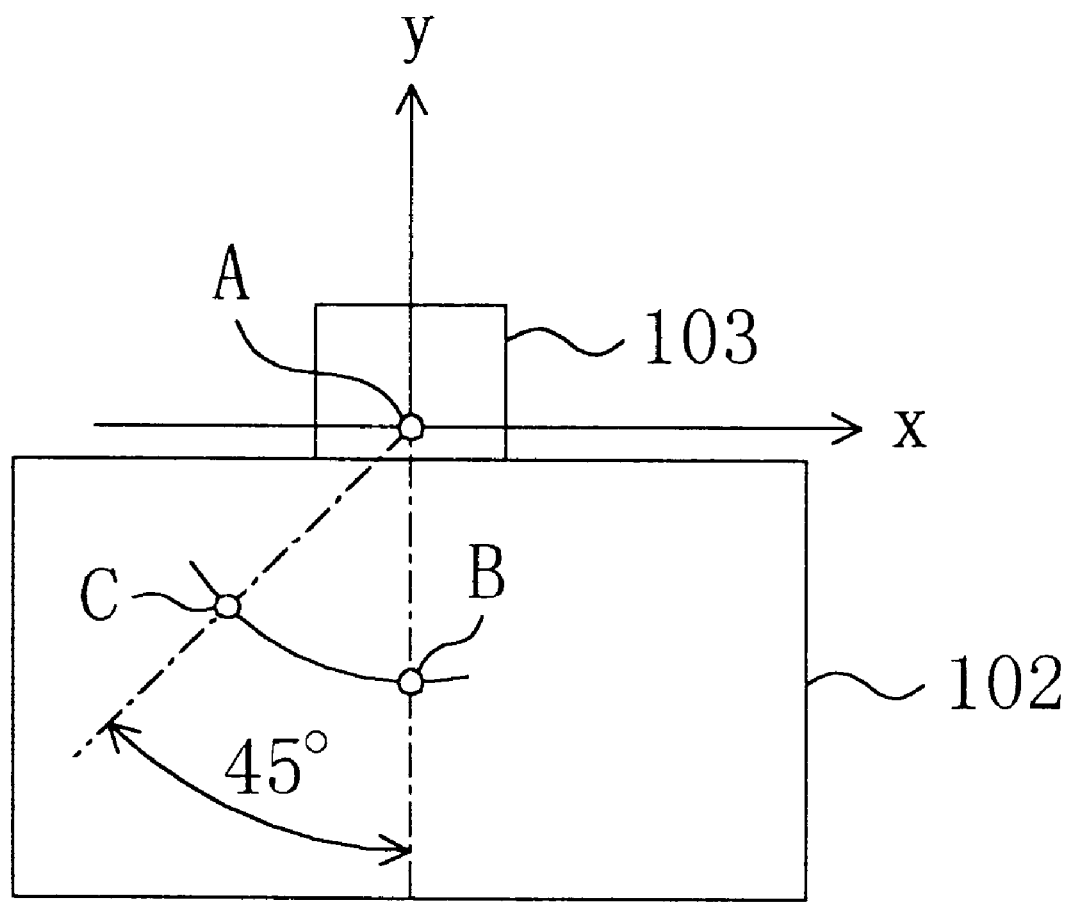
FIG. 18 is a diagram for showing an output portion of the semiconductor laser element, a collected portion of returning light and a collected portion of pump light from another semiconductor laser element in the optical fiber amplifier of the tenth embodiment.

FIG. 18 shows the positional relationship among the active layer (A), the collected portion (B) of the returning light and the pump light whose polarization directions are shown with the thick solid arrows, and the collected portion (C) of the pump light whose polarization directions are shown with the thick broken arrows. As is shown in FIG. 18, the collected portion (C) of the pump light whose polarization directions are shown with the thick broken arrows is moved from the active layer (A) with regard to the Y-axis in the X-axis negative direction. Therefore, when the monitor PD 108 is disposed in a position moved from the active layer (A) with regard to the Y-axis in the X-axis positive direction, namely, in an opposing position with regard to the Y-axis, the pump light can more scarcely enter the monitor PD 108.

In the bidirectional pumping type optical fiber amplifier of the tenth embodiment, when signal light has a low level, pump light emitted by one pump light source enters the other pump light source, so as to degrade an output characteristic of the semiconductor laser element of the latter pump light source or disturb stable optical output power by increasing monitored light intensity. In the optical fiber amplifier of the tenth embodiment, however, pump light emitted from one pump light source is not collected on the semiconductor laser element of the other pump light source. As a result, the degradation in the output characteristic of the semiconductor laser element can be prevented as well as stable optical output power can be attained because the monitored light intensity cannot be increased.

Although the optical fiber amplifier of the tenth embodiment includes the two semiconductor laser pump light sources, i.e., the first and second semiconductor laser pump light sources 301 and 302, these two semiconductor laser pump light sources can be replaced one semiconductor laser pump light source, with pump light emitted from the one semiconductor laser pump light source branched so as to bidirectionally enter the incidence portion 300a and the output portion 300b of the amplification optical fiber 300. In the case where the pump light emitted from one semiconductor laser pump light source is thus branched for the bidirectional pumping, there conventionally arise problems of unstable oscillation and the like because the pump light emitted by the semiconductor laser element included in the semiconductor laser pump light source can enter the semiconductor laser element itself. However, when any of the semiconductor laser modules of the first through ninth embodiments is used, the output light is not collected onto the semiconductor laser element, and hence, the unstable oscillation can be avoided.

Furthermore, as the wavelength band of a pump light source for an optical fiber amplifier of the 1.55 μm band, 1.48 μm, 0.98 μm or 0.82 μm is used, and as the wavelength band of a pump light source for an optical fiber amplifier of the 1.3 μm band, 1.062 μm or the like is used. The effects of the invention can be achieved in using the pump light of any of the wavelength bands by appropriately setting the optical axes of the doubly refracting crystal plates and the length of the optical path.

Also, when the bidirectional pump light sources have different wavelength bands, for example, when pump light of 0.98 μm and pump light of 1.48 μm are used, the effects of the invention can be achieved.

Furthermore, although the first and second amplification optical isolators 305 and 306 are respectively disposed by the incidence portion 300*a* and the output portion 300*b* of the amplification optical fiber 300 in the tenth embodiment, these amplification optical isolators can be replaced with one amplification optical isolator disposed at the center of the amplification optical fiber 300.

(Embodiment 11)

Figure 19:
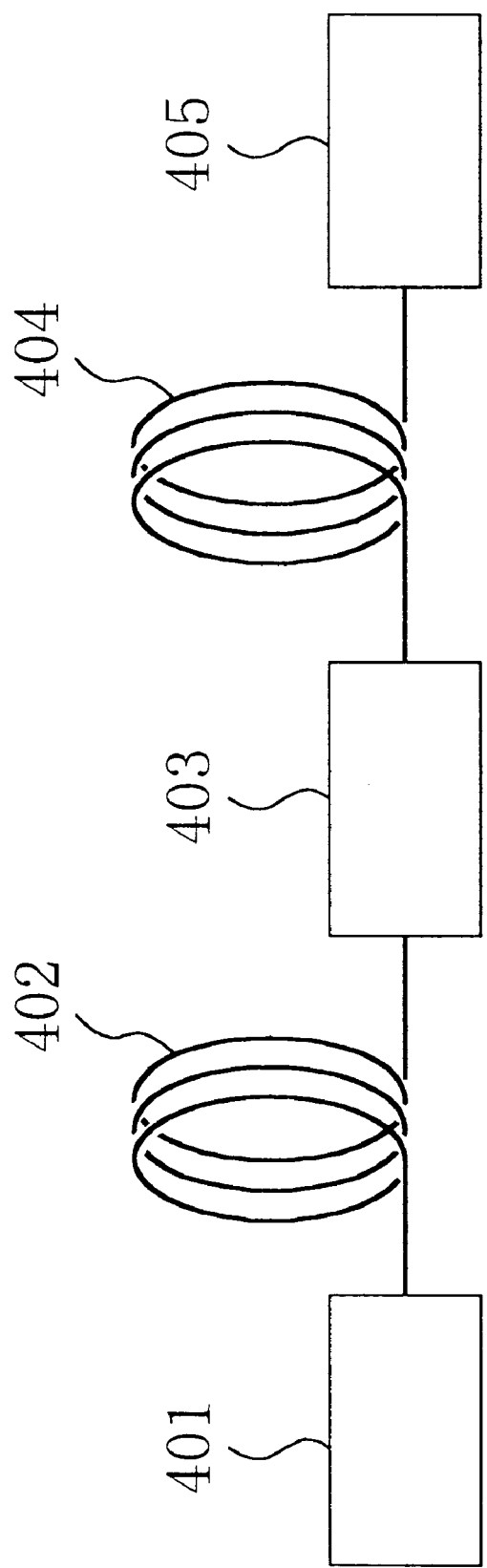
FIG. 19 is a diagram for showing the entire structure of an optical transfer system according to an eleventh embodiment.
Figure 20:
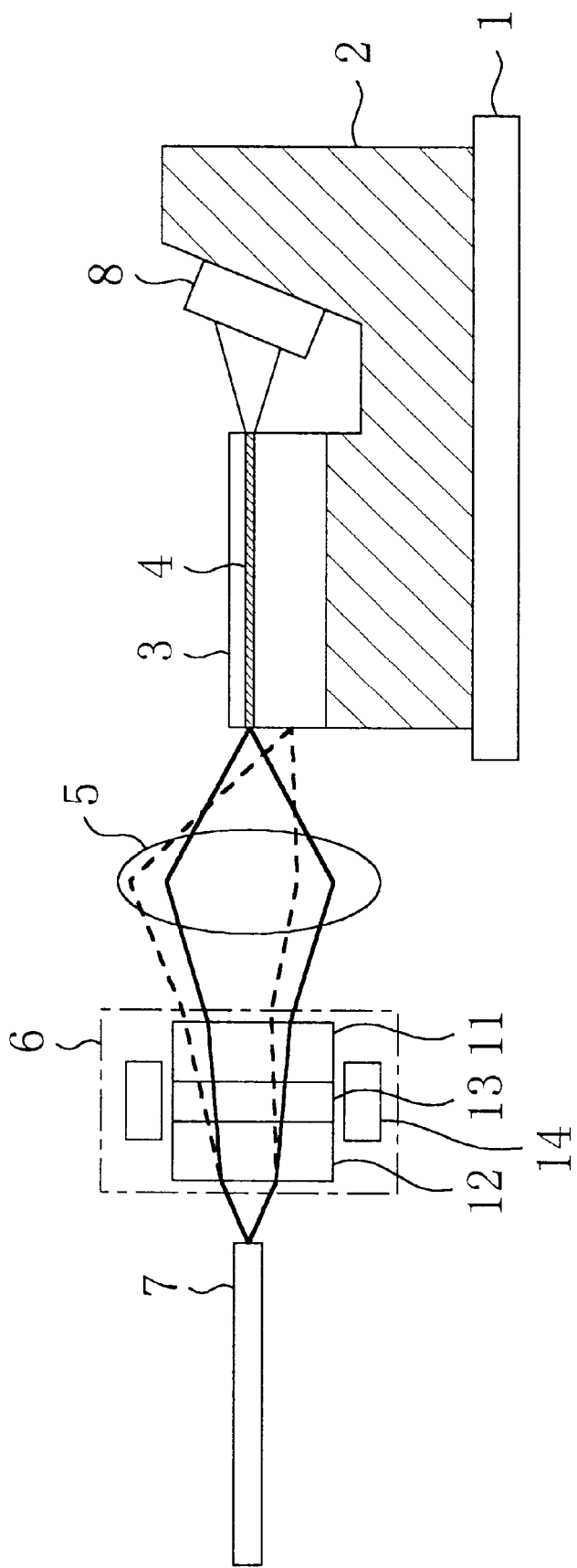
FIG. 20 is a sectional view of a semiconductor laser module according to a first conventional example.
Figure 21A:
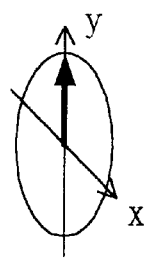
FIG. 21(a) shows a direction of an optical axis of a first doubly refracting crystal plate included in an optical isolator of the semiconductor laser module of the first conventional example.
Figure 21B:
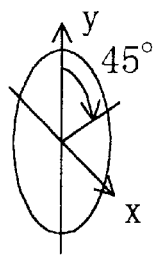
FIG. 21(b) shows a direction for rotating a polarization plane of light by a Faraday element included in the optical isolator and FIG. 21(c) shows a direction of an optical axis of a second doubly refracting crystal plate included in the optical isolator.
Figure 21C:
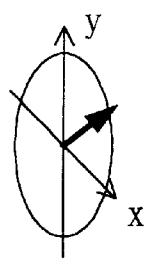
Figure 23:
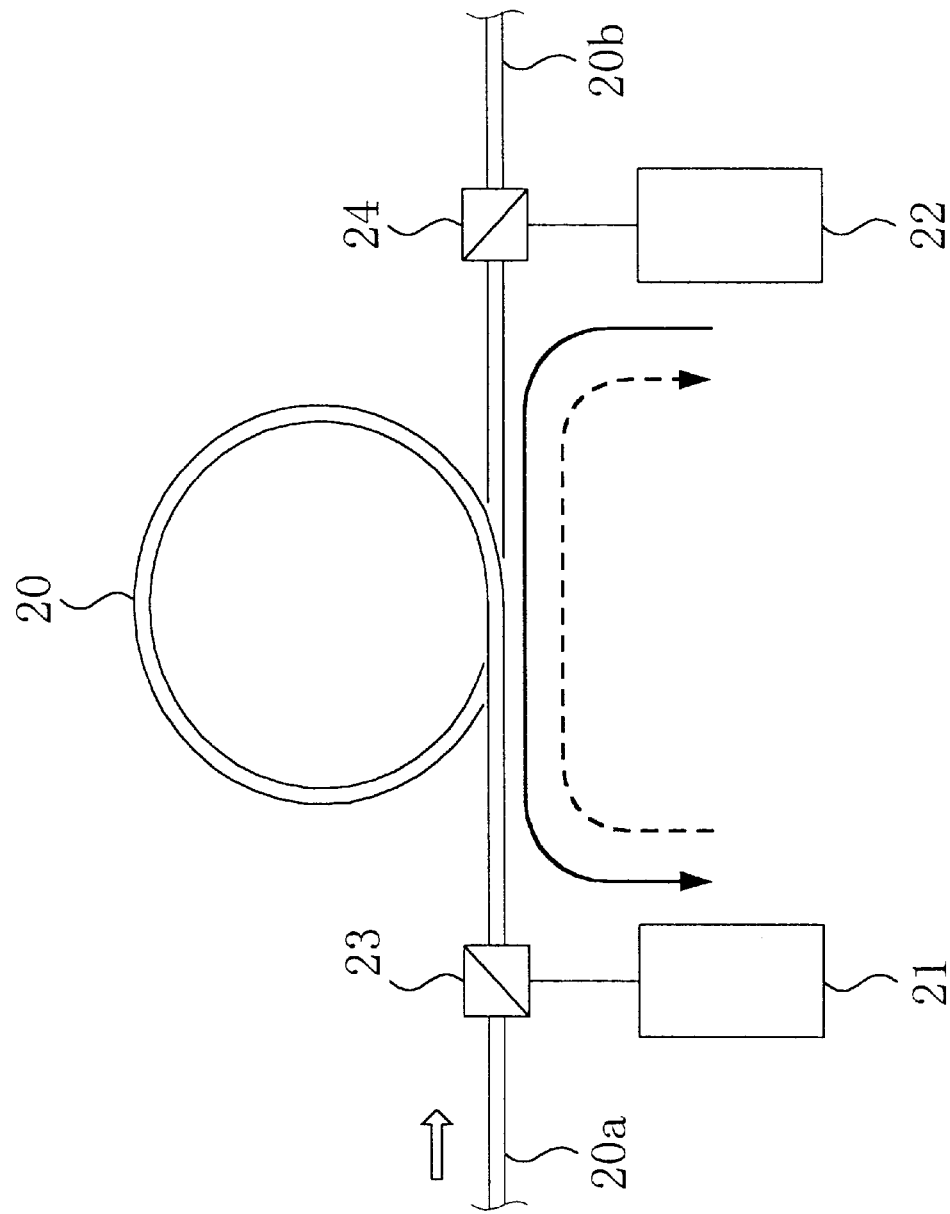
FIG. 23 is a diagram for showing the entire structure of the optical fiber amplifier according to the second conventional example.

FIG. 19 shows the entire structure of an optical transfer system according to an eleventh embodiment. As is shown in FIG. 19, an optical signal output from a transfer light source 401 is transferred through a first transfer optical fiber 402 with a length of approximately 50 km, and amplified by an optical fiber amplifier 403. The thus amplified optical signal is transferred through a second transfer optical fiber 404 with a length of approximately 50 km, so as to be received by a receiver 405. The optical fiber amplifier of the tenth embodiment can be used as the optical fiber amplifier 403.

In the case where an optical signal is transferred through an optical fiber with a large length, a transfer light source including a semiconductor laser element with high output power is required. However, when a laser beam with high output power enters a transfer optical fiber, the laser beam can disadvantageously return to the transfer light source due to the nonlinear optical effect such as Rayleigh's scattering.

As a countermeasure, the laser beam emitted by the semiconductor laser element is directly modulated so as to increase its effective line width.

However, the returning light from the transfer optical fiber is variously varied depending upon the type and the length of the optical fiber and modulation and intensity of signal light, and therefore, the monitored light intensity is increased, resulting in difficulty in obtaining stable optical output power. Accordingly, it is necessary to build an optical isolator in the semiconductor laser element used as the transfer light source, so as to prevent external incidence of a laser beam. Since the optical isolator including the doubly refracting crystal plates is comparatively inexpensive as compared with a polar core type optical isolator, the semiconductor laser module of this invention can also make contribution to realization of an easily spreadable transfer light source.

Moreover, a relay optical fiber amplifier is effective in long distance transfer of an optical signal, and application of the optical fiber amplifier of this invention can realize an easily spreadable optical transfer system.

What is claimed is:

1. A semiconductor laser module comprising:

a semiconductor laser element for emitting a laser beam from an active layer of said semiconductor laser element;

a laser holder for holding said semiconductor laser element at a bottom of said semiconductor laser element;

an optical isolator including a doubly refracting crystal plate, which transmits light having a polarization direction parallel to an optical axis thereof with refraction and transmits light having a polarization direction perpendicular to the optical axis thereof without refraction, and a Faraday element which rotates transmitted light in one direction by a predetermined angle;

a collective lens for collecting a laser beam emitted from a first output face of said active layer of said semiconductor laser element onto said optical isolator; and a photo detector for detecting light intensity of a laser beam emitted from a second output face of said active layer of said semiconductor laser element, wherein said active layer is formed in a position away from a center of a height of said semiconductor laser element to be closer to the bottom of said semiconductor laser element, and said optical isolator and said collective lens not only collect the laser beam emitted from said first output face of said active layer of said semiconductor laser element onto an incidence portion of an optical fiber but also collect returning light reflected by said incidence portion of said optical fiber onto a portion away from the bottom of said semiconductor laser element and closer to said laser holder.

2. The semiconductor laser module of claim 1, wherein said doubly refracting crystal plate is a rutile optical crystal plate.

3. The semiconductor laser module of claim 1, wherein said optical isolator and said incidence portion of said optical fiber are integrated with each other.

4. The semiconductor laser module of claim 1, wherein said optical isolator and said collective lens collect the returning light onto an end face of said laser holder, and a collected portion on said end face of said laser holder where the returning light is collected is provided with an antireflection coating.

5. The semiconductor laser module of claim 1, wherein said photo detector is disposed with a light receiving face thereof facing away from a plane perpendicular to a plane where said active layer is formed toward said laser holder.

6. The semiconductor laser module of claim 1, further comprising an output stabilizing device for constantly controlling an output power of the laser beam emitted from said active layer of said semiconductor laser element on the basis of an output current output by said photo detector.

7. An optical fiber amplifier comprising:

an amplification optical fiber doped with rare earth ions; and a pump light source for allowing pump light for pumping said rare earth ions doped in said amplification optical fiber to enter said amplification optical fiber, wherein said pump light source includes:

a semiconductor laser element for emitting a laser beam from an active layer of said semiconductor laser element;

a laser holder for holding said semiconductor laser element at a bottom of said semiconductor laser element;

an optical isolator including a doubly refracting crystal plate which transmits light having a polarization direction parallel to an optical axis thereof with refraction and transmits light having a polarization direction perpendicular to the optical axis thereof without refraction and a Faraday element which rotates transmitted light in one direction by a predetermined angle;

a collective lens for collecting a laser beam emitted from a first output face of said active layer of said semiconductor laser element onto said optical isolator;

a pumping optical fiber for supplying the laser beam emitted from said first output face of said active layer of said semiconductor laser element and passing through said collective lens and said optical isolator to said amplification optical fiber; and a photo detector for detecting light intensity of a laser beam emitted from a second output face of said active layer of said semiconductor laser element, said active layer is formed in a position away from a center of a height of said semiconductor laser element to be closer to the bottom thereof, and said optical isolator and said collective lens collect not only the laser beam emitted from said first output face of said active layer of said semiconductor laser element onto an incidence portion of said pumping optical fiber but also collect returning light reflected by said incidence portion of said pumping optical fiber onto a portion away from the bottom of said semiconductor laser element and closer to said laser holder.

8. An optical transfer system comprising:

a signal light source for outputting signal light;

a receiver for receiving the signal light;

a transfer optical fiber for transferring the signal light output by said signal light source to said receiver; and an optical fiber amplifier, including an amplification optical fiber doped with rare earth ions and a pump light source for outputting pump light for pumping said rare earth ions doped in said amplification optical fiber to said amplification optical fiber, for amplifying the signal light transferred through said transfer optical fiber, wherein said pump light source of said optical fiber amplifier includes:

a semiconductor laser element for emitting a laser beam from an active layer of said semiconductor laser element;

a laser holder for holding said semiconductor laser element at a bottom of said semiconductor laser element;

an optical isolator including a doubly refracting crystal plate which transmits light having a polarization direction parallel to an optical axis thereof with refraction and transmits light having a polarization direction perpendicular to the optical axis thereof without refraction and a Faraday element which rotates transmitted light in one direction by a predetermined angle;

a collective lens for collecting a laser beam emitted from a first output face of said active layer of said semiconductor laser element onto said optical isolator;

a pumping optical fiber for supplying the laser beam emitted from said first output face of said active layer of said semiconductor laser element and passing through said collective lens and said optical isolator to said amplification optical fiber; and a photo detector for detecting light intensity of a laser beam emitted from a second output face of said active layer of said semiconductor laser element, said active layer is formed in a position away from a center of a height of said semiconductor laser element to be closer to the bottom thereof, and said optical isolator and said collective lens not only collect the laser beam emitted from said first output face of said active layer of said semiconductor laser element onto an incidence portion of said pumping optical fiber but also collect returning light reflected by said incidence portion of said pumping optical fiber onto a portion away from the bottom of said semiconductor laser element and closer to said laser holder.

* * * * *